(12) United States Patent
Chang et al.

(10) Patent No.: US 11,785,870 B2
(45) Date of Patent: Oct. 10, 2023

(54) MEMORY CELL, SEMICONDUCTOR DEVICE INCLUDING MEMORY CELL, AND MANUFACTURING METHOD THEREOF

(71) Applicant: Taiwan Semiconductor Manufacturing Company, Ltd., Hsinchu (TW)

(72) Inventors: Kai-Tai Chang, Kaohsiung (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 121 days.

(21) Appl. No.: 17/144,089

(22) Filed: Jan. 7, 2021

(65) Prior Publication Data
US 2022/0216403 A1 Jul. 7, 2022

(51) Int. Cl.
*H10N 70/00* (2023.01)
*H10B 63/00* (2023.01)

(52) U.S. Cl.
CPC .......... *H10N 70/882* (2023.02); *H10B 63/30* (2023.02); *H10N 70/023* (2023.02)

(58) Field of Classification Search
CPC ....................................................... H01L 45/00
See application file for complete search history.

(56) References Cited

U.S. PATENT DOCUMENTS

2020/0176032 A1* 6/2020 Chiang ............... H01L 27/1159

FOREIGN PATENT DOCUMENTS

DE 102019115915 A1 * 6/2020 .......... G11C 11/161

* cited by examiner

*Primary Examiner* — Marvin Payen
(74) *Attorney, Agent, or Firm* — JCIPRNET

(57) ABSTRACT

A memory cell includes pair of metal layers, insulating layer, memory layer, selector layer, and word line. The pair of metal layers extends in a first direction. A first metal layer of the pair is disposed in contact with a second metal layer of the pair. The first metal layer includes a first material. The second metal layer includes a second material. The second metal layer laterally protrudes with respect to the first metal layer along a second direction perpendicular to the first direction. The insulating layer extends in the first direction and is disposed on top of the pair. The memory layer conformally covers sides of the pair. The selector layer is disposed on the memory layer. The word line extends along the second direction on the selector layer over the pair.

20 Claims, 33 Drawing Sheets

MEMORY CELL, SEMICONDUCTOR
DEVICE INCLUDING MEMORY CELL, AND
MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 13A are schematic perspective views of structures formed during a manufacturing process of a semiconductor device in accordance with some embodiments of the disclosure.

FIG. 5B to FIG. 13B are schematic cross-sectional views of the corresponding structures illustrated in FIG. 5A to FIG. 13A.

DETAILED DESCRIPTION

Figure 1:
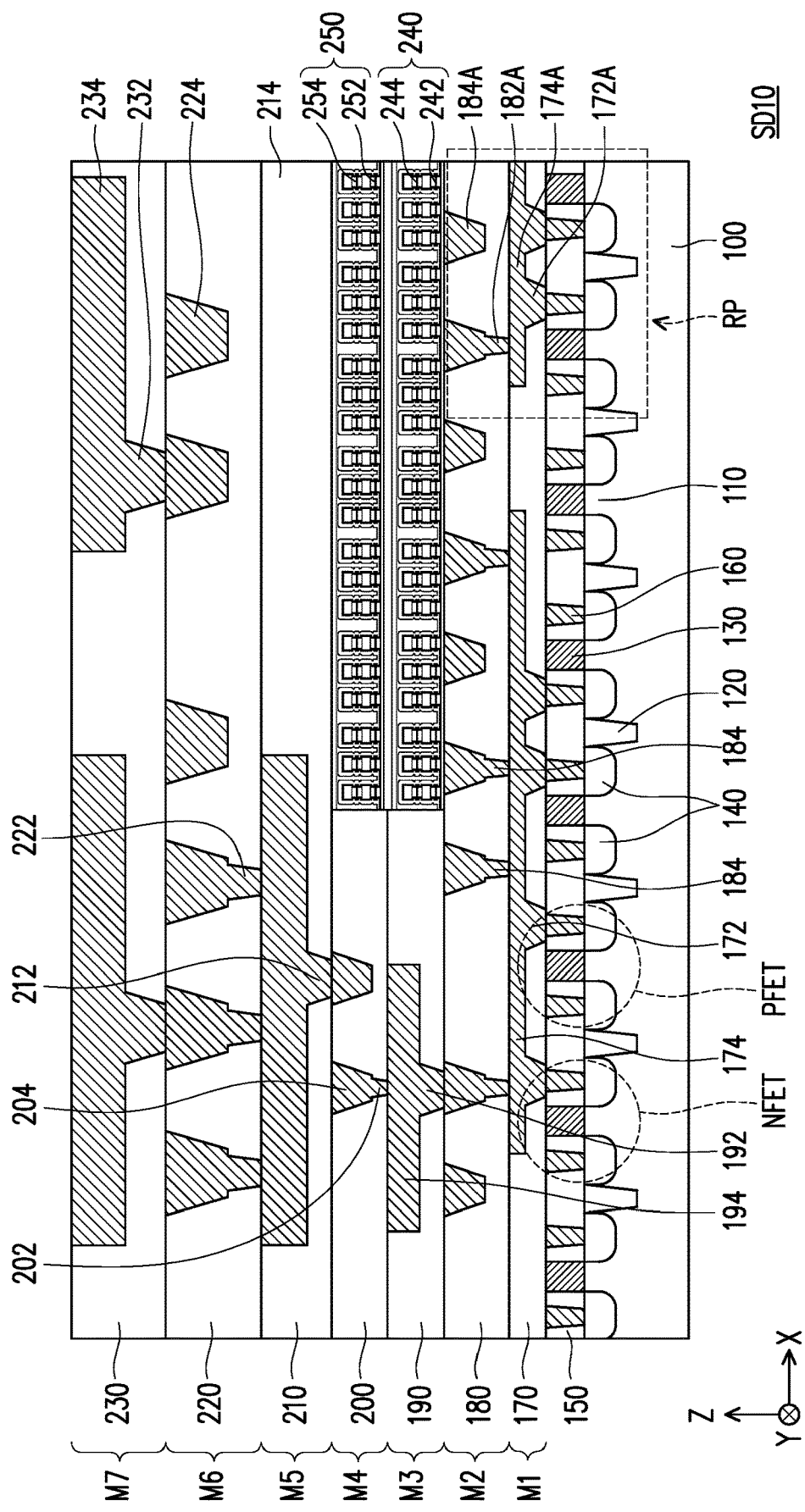
FIG. 1 is a schematic cross-sectional view of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of a semiconductor device SD10 according to some embodiments of the disclosure. The structure of FIG. 1 is taken in an XZ plane, where the directions X, Y, and Z define a set of orthogonal Cartesian coordinates. In some embodiments, the semiconductor device SD10 includes a semiconductor substrate 100. In some embodiments, the semiconductor substrate 100 includes one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, or a II-VI semiconductor. In some embodiments, the semiconductor substrate 100 may be a semiconductor-on-insulator, including at least one layer of dielectric material (e.g., an oxide layer) disposed between a pair of semiconductor layers. The semiconductor substrate 100 may include various regions that have been suitably doped with impurities of the desired conductivity (e.g., p-type or n-type dopants).

In some embodiments, devices of an integrated circuit are formed in and on the semiconductor substrate 100. For example, transistors may be formed in and/or on the semiconductor substrate 100. The transistors may be n-type field effect transistors NFET and/or p-type field effect transistors PFET. In some embodiments, the transistors are formed over fins 110 formed on the semiconductor substrate 100. The transistors may be separated from each other by isolation structures 120 formed in the semiconductor substrate 100. For example, the isolation structures 120 may be shallow trench isolation structures. The transistors may include gate structures 130 disposed over the fins 110 and source/drain regions 140 disposed in the semiconductor substrate 100 besides the fins 110, at opposite sides of the gate structures 130. A dielectric layer 150 is disposed over the semiconductor substrate 100, covering the transistors. Source/drain contacts 160 extend across the dielectric layer 150 to contact the source/drain regions 140. It should be noted that while the transistors in FIG. 1 have been described as FIN FET transistors, the disclosure is not limited thereto, and other types of transistor (e.g., GAA, planar, etc.) are also contemplated within the scope of the disclosure. Similarly, devices other than transistors (e.g., inductors, resistors, capacitors, diodes, and so on) may also be part of the semiconductor device SD10.

In some embodiments, the semiconductor device SD10 includes multiple metallization levels M1-M7 interconnecting the devices formed on the semiconductor substrate 100 in an integrated circuit. It should be noted that while FIG. 1 illustrates seven metallization levels M1-M7, the disclosure is not limited thereto. In some alternative embodiments, more or fewer metallization levels M1-M7 may be formed depending on circuit design requirement.

In some embodiments, the metallization levels M1-M7 include one or more interlayer dielectric (ILD) layers alternately stacked with metallization patterns. The metallization patterns include routing traces extending on the ILD layers and routing vias interconnecting the routing traces with underlying routing traces and/or devices. For example, the bottommost metallization level M1 includes the ILD layer 170, the routing vias 172, and the routing traces 174. The routing traces 174 extend on the ILD layer 170, and are interconnected to the devices formed on the semiconductor substrate 100 by the routing vias 172. The metallization level M2 includes the ILD layer 180, the routing vias 182, and the routing traces 184. The routing traces 184 extend on the ILD layer 180, while the routing vias 182 extend across the ILD layer 180 to interconnect the routing traces 184 with the routing traces 174. Similarly, the metallization level M3 includes the ILD layer 190, the routing vias 192, and the routing traces 194; the metallization level M4 includes the ILD layer 200, the routing vias 202, and the routing traces 204; the metallization level M5 includes the ILD layer 210, the routing vias 212, and the routing traces 214; the metallization level M6 includes the ILD layer 220, the routing vias 222, and the routing traces 224; and the metallization level M7 includes the ILD layer 230, the routing vias 232, and the routing traces 234.

In some embodiments, at least some of the routing traces located in different metallization levels may extend perpendicular to each other. For example, the routing traces 174 of the bottommost metallization level M1 may extend along the X direction, while the routing traces 184 of the metallization level M2 may extend along the Y direction.

In some embodiments, one or more memory arrays 240, 250 are disposed in some of the metallization levels, for example in the metallization level M3 and M4. In some embodiments, the memory arrays 240, 250 may include memory cells 242, 244, 252, 254 stacked in one or more layers. For example, the memory array 240 includes the memory cells 242 disposed in a lower memory layer and the memory cells 244 disposed on the memory cells 242 of the lower memory layer. Similarly, the memory array 250 may include lower memory cells 252 and upper memory cells 254 disposed on the lower memory cells 252. It should be noted that the disclosure does not limit in which metallization level the memory arrays 240, 250 are formed. In some alternative embodiments, the memory arrays 240, 250 may be formed in different metallization levels (e.g., M4 and M5, M5 and M6, and so on) than the ones illustrated in FIG. 1.

In some embodiments, some of the underlying or overlying metallization levels with respect to the memory arrays 240, 250 (e.g., the metallization levels M1 and M2), are used for peripheral circuits RP of the memory arrays 240, 250, including row and column decoders, for example. In some embodiments, at least part of the routing vias 172 and 182 (e.g., the routing vias 172A and 182A) and of the routing traces 174 and 184 (e.g., the routing traces 174A and 184A) are part of the peripheral circuit RP of the memory arrays 240, 250, while the remaining routing vias 172, 182 and routing traces 174, 184 may be integrated with other devices to perform different logic functions.

FIG. 2 to FIG. 19 are schematic views of structures formed during a manufacturing method of the semiconductor device SD10 according to some embodiments. FIG. 2, FIG. 3, and FIG. 14 to FIG. 19 are schematic cross-sectional views taken in the same XZ plane as FIG. 1. FIG. 4 and FIG. 5A to FIG. 13A are schematic perspective views of a region of the semiconductor device SD10 in which the memory array 240 is being manufactured, while FIG. 5B to FIG. 13B are schematic cross-sectional views of the corresponding structures of FIG. 5A to FIG. 13A. The views of FIG. 5B to FIG. 13B are taken in an XZ plane located at the level height of the line I-I' along the Y direction.

Figure 2:
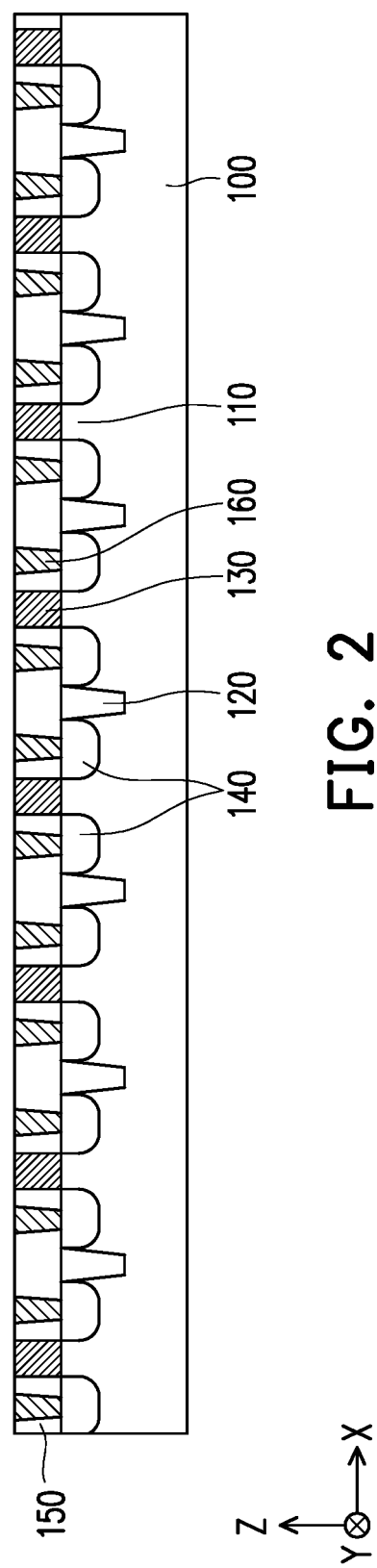
FIG. 2 and FIG. 3 are schematic cross-sectional views of structures formed during a manufacturing process of a semiconductor device in accordance with some embodiments of the disclosure.

In FIG. 2, transistors (e.g., FIN FETs) are formed on the semiconductor substrate 100. The fins 110 are patterned according to any suitable method, for example by using one or more photolithography processes, such as double-patterning or multi-patterning. Sacrificial layers (not shown) may be optionally formed over the semiconductor substrate 100 during patterning of the fins 110, for example to obtain fins 110 of finer pitch. Such sacrificial layers may be removed once the fins 110 are patterned.

The isolation structures 120 are formed, for example, by depositing one or more layers of insulating materials. An etch back process may be optionally performed to obtain isolation structures 120 of desired height. The isolation structures 120 may include any suitable insulating material, such as spin-on-glass, silicon oxide, silicon oxynitride, silicon nitride, silicon oxycarbonitride, fluoride-doped silicate glass, or a combination thereof.

The gate structures 130 may be formed according to any suitable process, for example by a gate replacement process. Dummy gate structures (not illustrated) may be initially formed over the intended location of the gate structures 130. Sidewall spacers are formed at opposite sides of the dummy gate structures, for example by depositing an insulating material over the dummy gate structures and then performing a back-etching process, to leave sidewall spacers at the sides of the dummy gate structures. The source/drain regions 140 may then be formed in the fins 110, for example by removing portions of the fins 110 to form recesses in which one or more source/drain epitaxial layers are grown to form the source/drain regions 140. The epitaxial layers may include dopants of suitable conductivity type according to the type (e.g., n-type or p-type) of transistor being fabricated. In some alternative embodiments, the source/drain regions 140 may be grown on the fins 110, without preliminary removing portions of the fins 110.

The dielectric layer 150 is then blanketly formed over the semiconductor substrate 100, burying the source/drain regions 140 and the dummy gate structures. The dielectric layer 150 may include a silicon-based insulating material, such as silicon oxide, SiCOH, SIOC, and/or SiOCN; low-k materials, such as Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof; or any other suitable dielectric material. The dielectric layer 150 may be fabricated to a suitable thickness by chemical vapor deposition (CVD, for example flowable CVD, HDPCVD, SACVD, etc.), spin-on, sputtering, or other suitable methods. A planarization process, such as grinding, chemical-mechanical polish, or the like, may be performed so that the top portion of the dummy gate structures are exposed. The dummy gate structure may then be removed, exposing the fins 110 at the bottom of the evacuated spaces.

Thereafter, the gate structures 130 may be formed in place of the dummy gate structures. The gate structures 130 may include one or more stacked layers, such as a gate dielectric layer and one or more gate metal layers. The gate dielectric layer may include an interfacial layer including a dielectric material such as silicon oxide or silicon oxynitride (SiON), and a high-k layer formed over the interfacial layer. The gate interfacial layer may be formed by depositing the dielectric material via suitable deposition process, such as atomic layer deposition (ALD), CVD, or the like. In some alternative embodiments, the gate interfacial layer may be formed via an oxidation process. The profile of the interfacial layer may change according to the production method followed. In some embodiments, the material of the high-k layer has a dielectric constant greater than about 4, greater than about 12, greater than about 16, or even greater than about 20. For example, a material of the high-k layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfSiO, or a combination thereof, or other suitable materials. In some embodiments, the material of the high-k layer may optionally include a silicate such as HfSiO, HfSiON LaSiO, AlSiO, or a combination thereof. In some embodiments, the method of forming the high-k layer includes performing at least one suitable deposition technique, such as CVD, ALD (including, e.g., metal oxide chemical vapor deposition, MOCVD, remote plasma atomic layer deposition, RPALD, plasma-enhanced atomic layer deposition, PEALD, etc.), molecular beam deposition (MBD), or the like.

The gate metal layers may include a work-function layer and a gate electrode. A material of the work function layer may be selected according to the conductivity type desired for the transistor. Exemplary p-type work function materials include TiN, TaN, Ru, Mo, Al, WN, $ZrSi_2$, $MoSi_2$, $TaSi_2$, $NiSi_2$, other suitable p-type work function materials, or combinations thereof. On the other hand, exemplary n-type work function materials include Ti, Ag, TaAl, TaAlC, TiAlN, TaC, TaCN, TaSiN, Mn, Zr, other suitable n-type work function materials, or combinations thereof. In some embodiments, the method of forming the work function layer includes performing at least one suitable deposition technique, such as CVD, ALD, MBD, or the like. In some embodiments, the work function layer serves the purpose of adjusting a threshold voltage of the transistor. In some embodiments, the gate electrode is formed over the work function layer. In some embodiments, a material of the gate electrode includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate electrode may be formed by CVD, ALD, plating, other deposition techniques, or a combination thereof. In some embodiments, the gate structures 130 may further include barrier layers, liner layers, seed layers, adhesion layers, etc.

The source/drain contacts 160 are then formed by providing a conductive material in contact holes opened through the dielectric layer 150. In some embodiments, the conductive material is disposed on portions of the source/drain regions 140 exposed by the contact holes. In some embodiments, the conductive material of the source/drain contacts 160 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by CVD, ALD, plating, other deposition techniques, or a combination thereof. In some embodiments, the conductive material may be provided on one or more seed layers, barrier layers, etc. (not shown).

Figure 3:
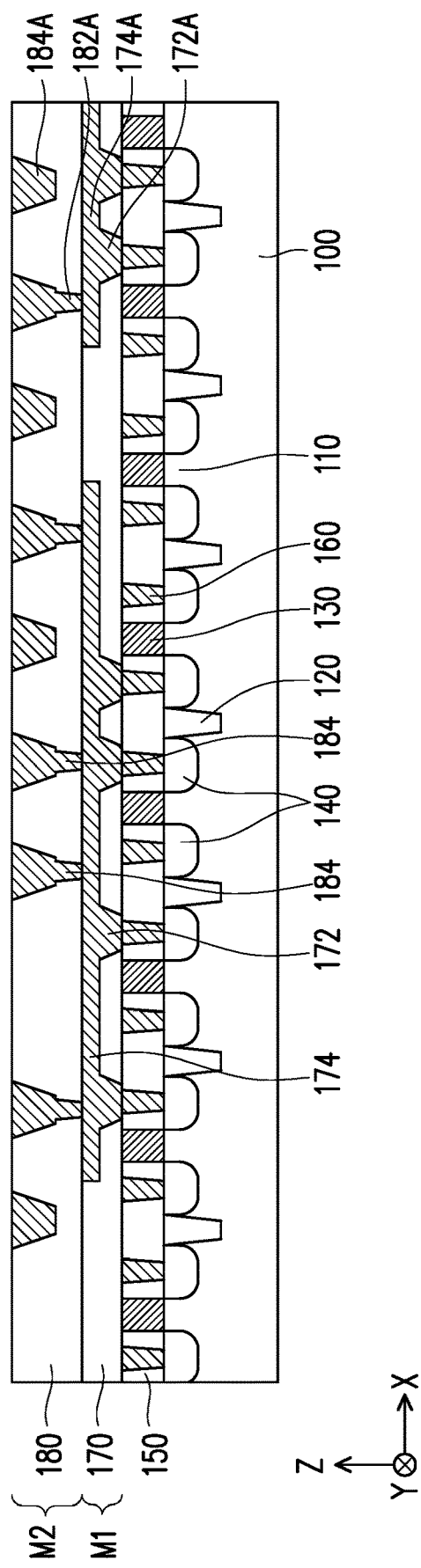

In FIG. 3, the metallization levels M1 and M2 are sequentially formed on the dielectric layer 150 over the semiconductor substrate 100. A material and a manufacturing method of the ILD layers 170 and 180 may be independently selected from the materials and methods listed above for the dielectric layer 150. The routing vias 172, 182 and the routing traces 174, 184 include cobalt (Co), tungsten (W), copper (Cu), titanium (Ti), tantalum (Ta), aluminum (Al), zirconium (Zr), hafnium (Hf), a combination thereof, or other suitable metallic materials, and may be formed through suitable processes such as, for example, single or dual damascene.

Figure 4:
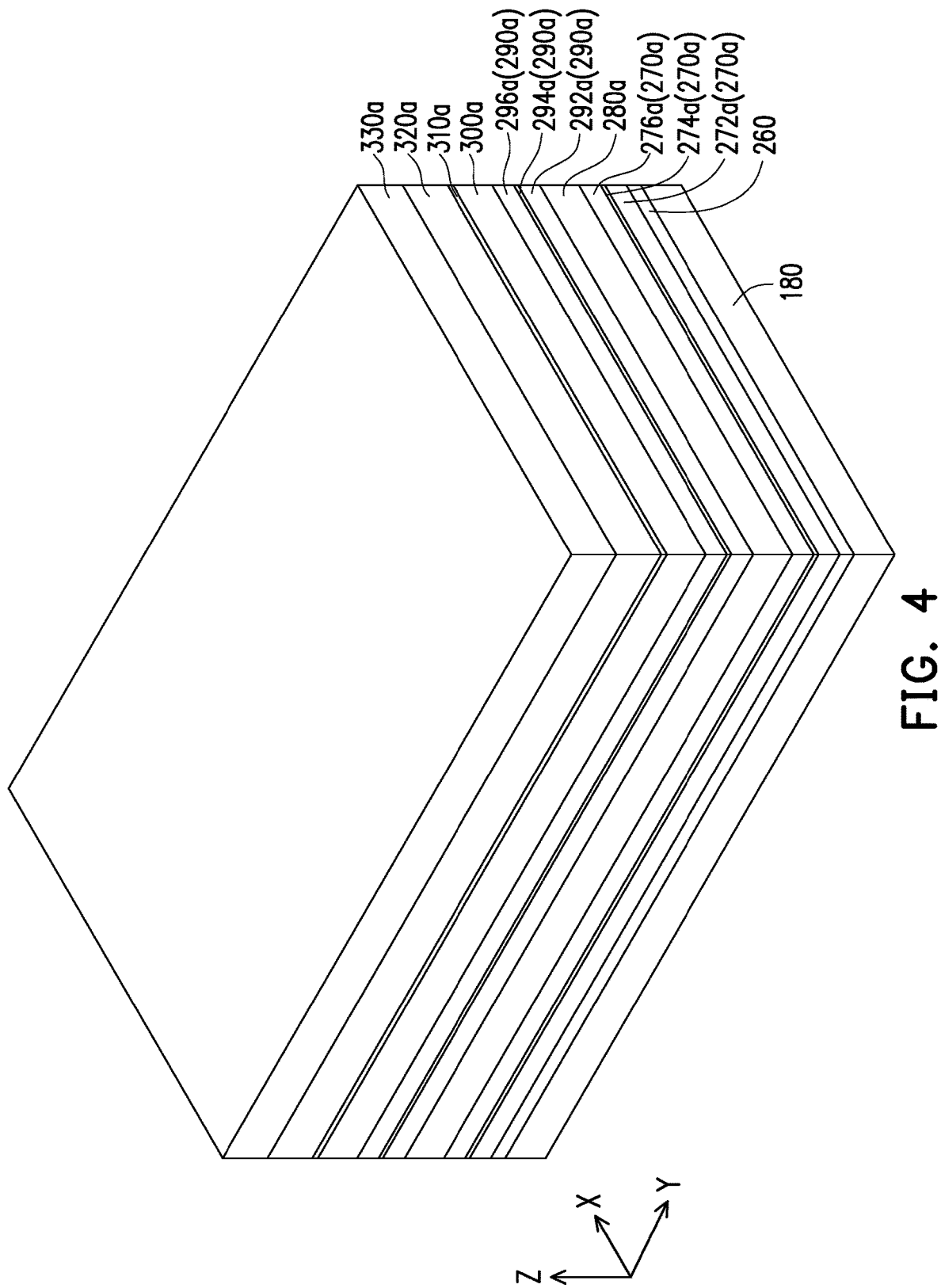
FIG. 4 is a schematic perspective view of a structure formed during a manufacturing process of a semiconductor device in accordance with some embodiments of the disclosure.

In FIG. 4, stacked layers are formed over the metallization level M2. For the sake of simplicity, in FIG. 4 to FIG. 13B the metallization level M2 and the underlying structure illustrated in FIG. 3 are schematically represented as the plain ILD layer 180. The stacked layers may be initially blanketly formed as sheets over the metallization level M2. The stacked layers include, from the bottom to the top, an etch stop layer 260, a metal layer 272a of a lower bit line 270a, a metal layer 274a of the lower bit line 270a, a metal layer 276a of the lower bit line 270a, an insulating layer 280a, a metal layer 292a of an upper bit line 290a, a metal layer 294a of the upper bit line 290a, a metal layer 296a of the upper bit line 290a, an insulating layer 300a, a pad layer 310a, an insulating layer 320a, and a sacrificial layer 330a.

The etch stop layer 260 includes a material having a lower etching rate in selected conditions with respect to the material of the metal layer 272a. For example, the etch stop layer 260 may include a nitride-containing material, such as silicon nitride, silicon oxynitride, or the like. The etch stop layer 260 may be formed of a desired thickness, for example in the range from about 5 nm to about 20 nm, by ALD, CVD, or other suitable processes.

The metal layer 272a and the metal layer 276a of the lower bit line 270a may include the same metallic material, for example tungsten, titanium, titanium nitride, ruthenium, tantalum, tantalum nitride, cobalt, nickel, copper, aluminum, alloys thereof, silicide, or other suitable conductive materials. In some embodiments, the metallic material of the metal layer 272a and the metal layer 276a includes at least one selected from tungsten, titanium, titanium nitride, ruthenium, tantalum, tantalum nitride, and a combination thereof.

In some embodiments, the metal layer 274a of the lower bit line 270a includes a different metallic material than the metal layer 272a and the metal layer 276a. In some embodiments, while the material of the metal layer 274a may be selected from the same materials listed above for the metal layer 272a and the metal layer 276a, the material of the metal layer 274a and the material of the metal layers 272a and 276a are selected so that the metal layer 274a has a lower (electric) resistance than the metal layer 272a and the metal layer 276a. For example, the material of the metal layer 274a may have a lower resistivity than the material of the metal layers 272a and 276a. For example, in some cases the metal layers 272a, 276a may include titanium, and the metal layer 274a may include tungsten. In some alternative embodiments, the metal layers 272a, 276a may include tungsten, and the metal layer 274a may include ruthenium.

The metal layers 272a, 274a, 276a of the lower bit line 270a can be formed by suitable deposition processes, such as ALD, CVD, e-beam evaporation, or the like. In some embodiments, the metal layer 274a is formed so as to be thinner than each of the metal layer 272a and the metal layer 276a. For example, each one of the metal layer 272a and the metal layer 276a may independently be up to 1-10 times thicker than the metal layer 274a. In some embodiments, the thickness of the metal layer 274a may be equal to or less than 10 nm, for example ranging from 1 nm to 10 nm. In some embodiments, the thickness of the lower bit line 270a may be in the range from about 20 nm to about 40 nm.

The upper bit line 290a may have a similar structure as previously described for the lower bit line 270a, with the materials and thicknesses of the metal layers 292a, 294a, and 296a selected as previously described for the metal layers 272a, 274a, and 276a of the lower bit line 270a, respectively. In some embodiments, the lower bit line 270a and the upper bit line 290a have the same structure, but the disclosure is not limited thereto. In some alternative embodiments, the lower bit line 270a and the upper bit line 290a have different structures.

The insulating layers 280a and 300a may include an oxide or nitride insulating material, which may be silicon based, such as silicon oxide, silicon oxynitride, silicon nitride, a combination thereof, or may be other than silicon based, such as aluminum oxide, aluminum nitride, aluminum oxynitride, or the like. In some embodiments, the insulating layer 280a is silicon based, and the insulating layer 300a is aluminum based. In some embodiments, the thicknesses of the insulating layers 280a and 300a are independently in the range from about 5 nm to about 20 nm. The insulating layers 280a and 300a may be formed by ALD, CVD, or other suitable deposition processes.

The pad layer 310a includes an insulating material, and may also be considered an insulating layer. In some embodiments, the pad layer 310a includes an insulating oxide, such as silicon oxide or the like. In some embodiments, the material of the pad layer 310a is different from the material of the insulating layer 300a, so that selective etching between the two layers may be possible. For example, portions of the pad layer 310a may be selectively removed with respect to the underlying insulating layer 300a. The pad layer may be formed by suitable deposition processes, such as ALD, CVD, or the like.

The insulating layer 320a includes a nitride material, such as silicon nitride or silicon oxynitride, and may also be formed by deposition processes such as ALD, CVD, or the like.

The sacrificial layer 330a, sometimes referred to as hardmask layer, may be a single layer or a composite layer. In some embodiments, the sacrificial layer 330a includes at least one layer of an insulating oxide, such as silicon oxide. When the sacrificial layer 330a has a composite structure, layers of different materials may be stacked over each other. For example, a layer of insulating oxide may be disposed on the insulating layer 320a, a layer of an insulating nitride (e.g., silicon nitride) may be disposed on the layer of insulating oxide, and another layer of insulating oxide may be disposed on the layer of insulating nitride. The structure of the sacrificial layer 330a may be adapted depending on process (e.g., patterning) requirements.

Figure 5A:
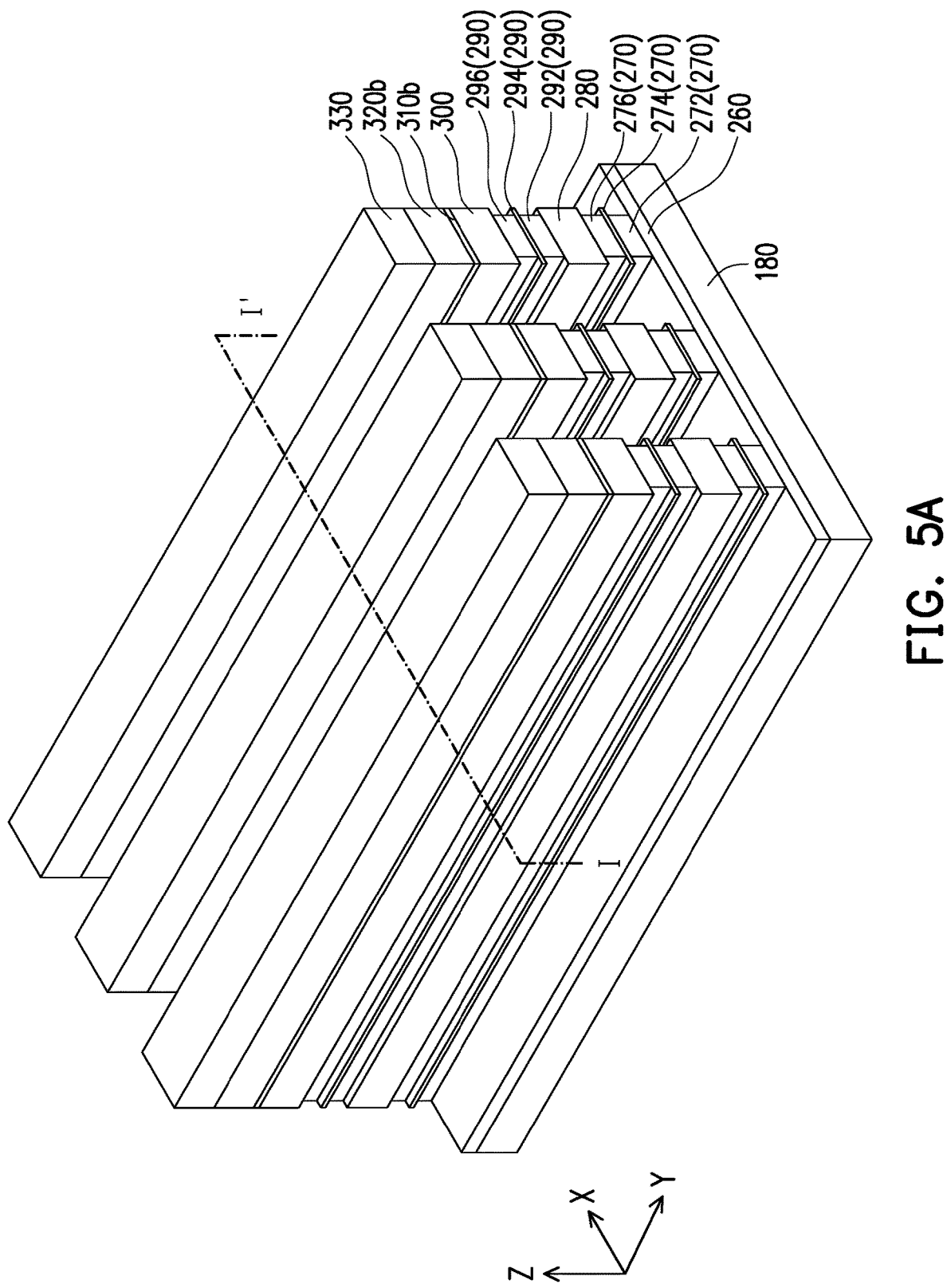
Figure 5B:
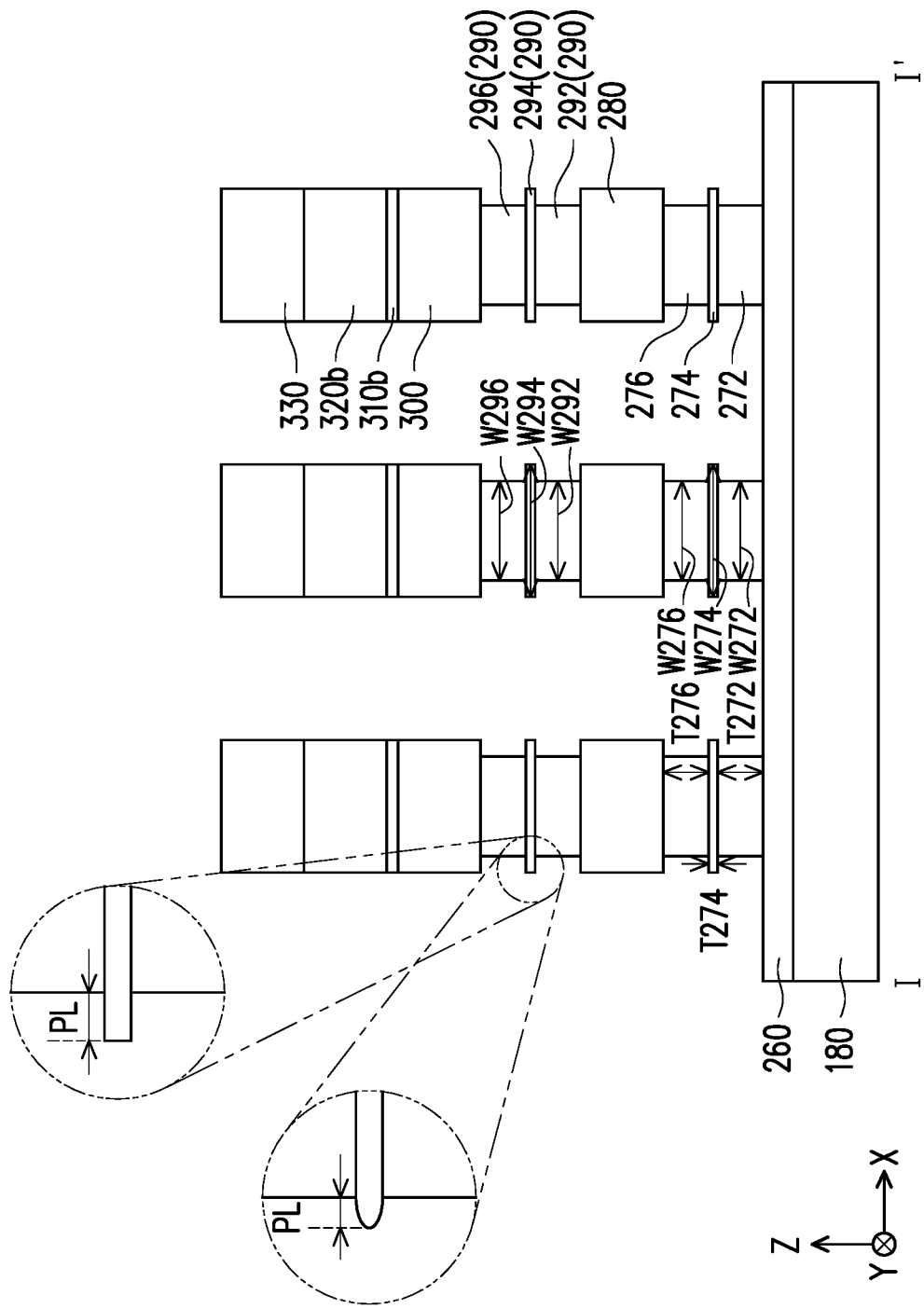
Figure 6A:
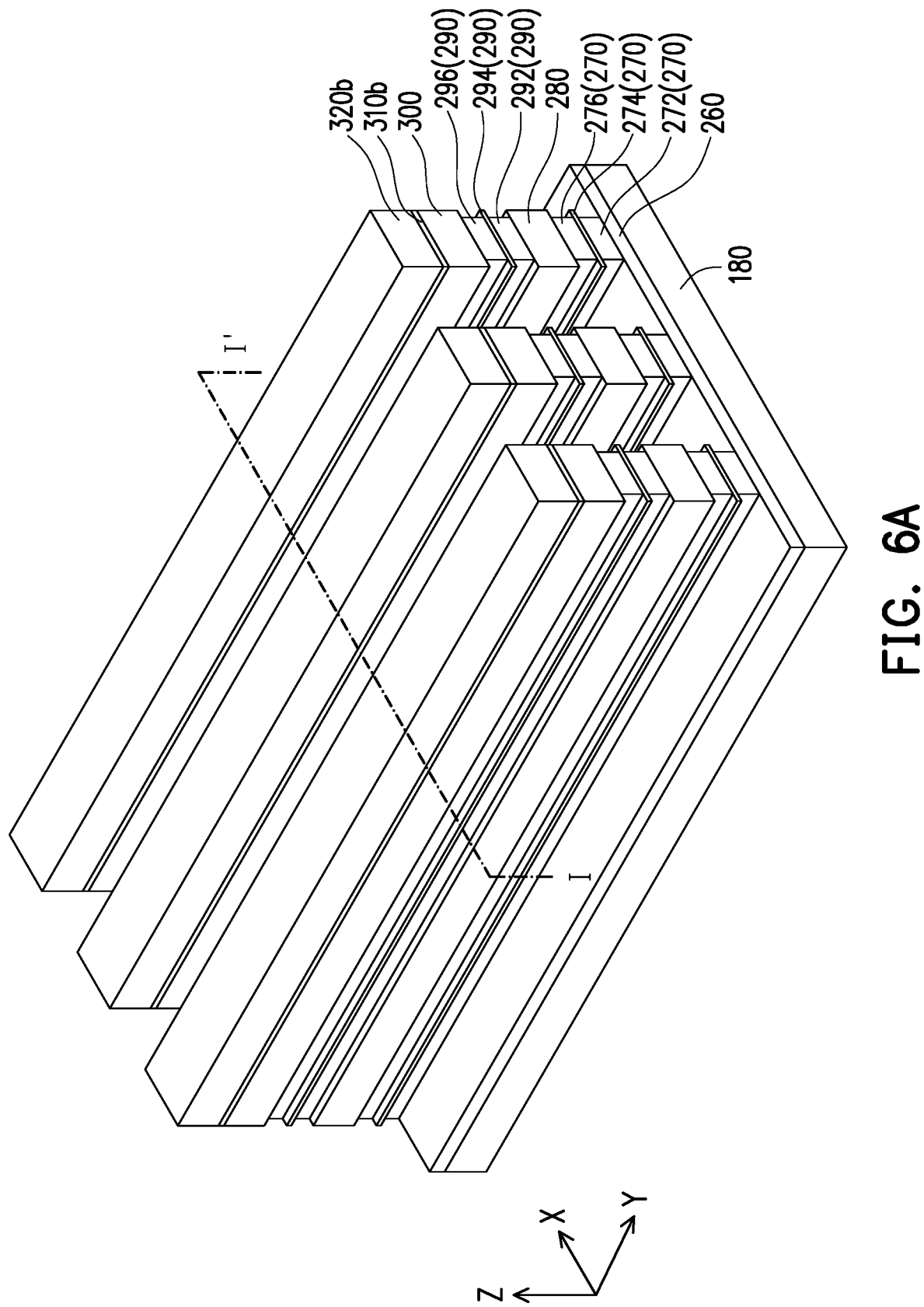
Figure 6B:
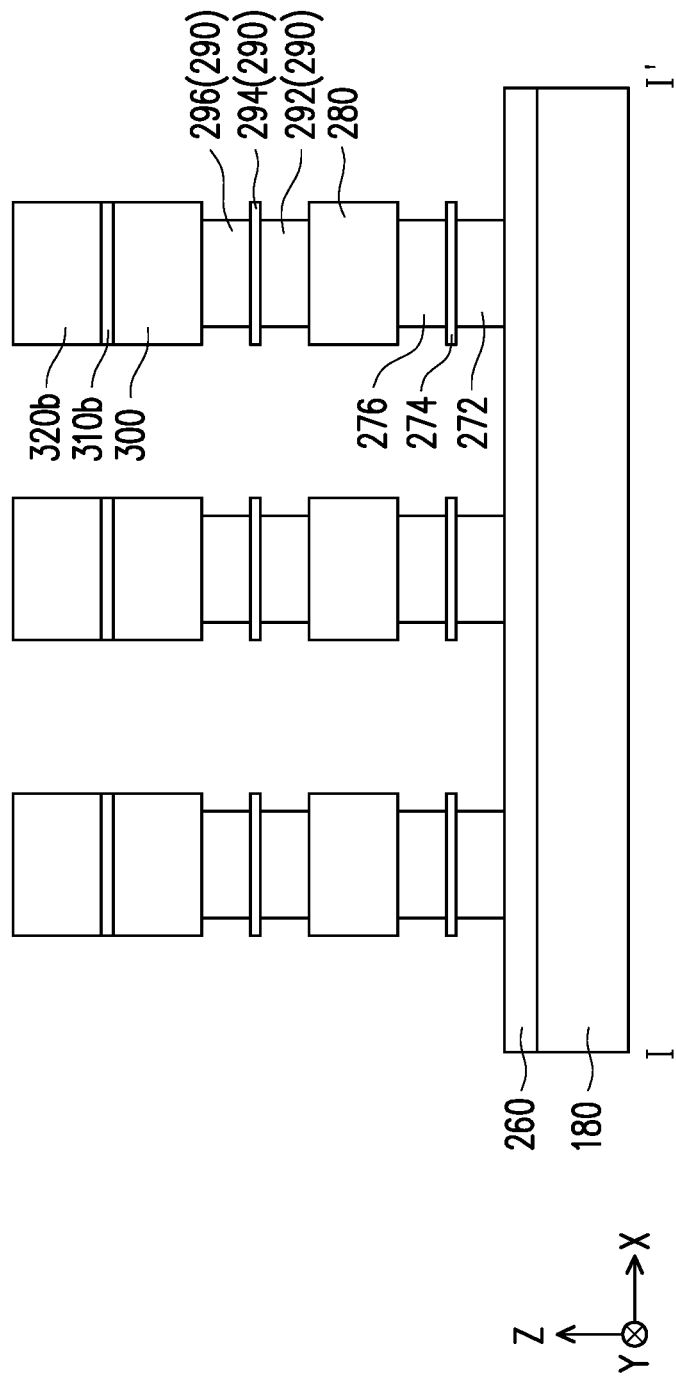

Referring to FIG. 4, FIG. 5A and FIG. 5B, the stacked layers are patterned to form bit lines, for example via one or more lithography and etching steps. In some embodiments, an auxiliary mask (not illustrated) may be formed on the sacrificial layer 330a. The auxiliary mask may be patterned to have the shape of parallel strips extending along the Y direction and disposed at a distance from each other along the X direction. The auxiliary mask may include a photoresist material, and may be formed by a sequence of deposition, exposure, and developing steps. The pattern of the auxiliary is initially transferred to the sacrificial layer 330a, through one or more etching steps. The pattern of the sacrificial layer 330a is then transferred to the underlying layers, stopping at the etch stop layer 260. Among the underlying layers, the insulating layers 280, 300, 320b, and the pad layer 310b may have substantially the same width along the X direction as the sacrificial layer 330 after patterning. In the lower bit lines 270 and the upper bit lines 290, the metal layers 272 and 292 and the metal layers 276 and 296 may have a smaller widths W272, W292, W276, W296 along the X direction than the adjacent insulating layers 280, 300, while the metal layers 274 and 294 may have widths W274, W294 comparable to the insulating layers 280, 300. That is, the metal layers 274, 294 laterally protrude (e.g., of a protruding length PL) with respect to the side edges of the corresponding metal layers 272, 292 and metal layers 276, 296. In some embodiments, the metal layers 272, 292 and the metal layers 276, 296 may be considered to be recessed with respect to the metal layers 274, 294. In some embodiments, the shape of the upper bit lines 290 and the lower bit lines 270 may be determined through dedicated etching steps, taking advantage of differences in etching rates between the material of the metal layers 274, 294 with respect to the material of the metal layers 272, 292 and the metal layers 276, 296. It should be noted that while the lateral profile of the metal layers 274, 294 is shown as having sharp edges and corners, the disclosure is not limited thereto. As illustrated in the insets in FIG. 5B, in some embodiments the edges of the metal layers 274, 294 may be tapered, even rounded, rather than sharp, depending on the conditions adopted during patterning of the bit lines 270, 290 As discussed above, the metal layers 274, 294 may be thinner than the corresponding adjacent metal layers 272, 276 or 292, 296. Taking as an example the bit line 270, if the metal layers 272, 274, 276 are considered to have thicknesses T272, T274, and T276, respectively, the thickness ratio of each of the metal layer 272 and the metal layer 276 to the metal layer 274 (e.g., T272/T274 and T276/T274) ranges from about 20:1 to 1:1, e.g., from 10:1 to 5:1. Similar relationships apply for the upper bit line 290. All the thicknesses of the disclosure are measured along the (vertical) Z direction (e.g., normal to the top surface of the ILD layer 180).

In some embodiments, the inclusion of the metal layers 274, 294 in between the metal layers 272, 292, and the metal layers 276, 296 allows for finer control of the electric field applied within the memory cells (e.g., the memory cells 242, 244 illustrated in FIG. 1). For example, the memory array being fabricated may be a filamentary resistive random access memory (filamentary RRAM), which may require the capability to manipulate the applied electrical field to direct the filaments of current flowing during operation of the memory. In some embodiments, the inclusion of the metal layers 274, 294 having lower resistance than the other metal layers 272, 292, 276, 296 of the bit lines 270 and 290 allows to control the electrical field so as to enable operations of the filamentary RRAM. In some embodiments, patterning the metal layers 274, 294 laterally protruding with respect to the metal layers 272, 292 and the metal layers 276, 296 facilitates concentration of the current flows through the protruding metal layers 274, 294. In some embodiments, the bit lines 270, 290 may enhance reliability and storage stability of the corresponding devices. In some embodiments, realization of the bit lines 270, 290 may be easily integrated within existing process flows, containing the manufacturing costs.

After patterning, stacked bit lines 270, 290 separated by the insulating layers 280, 300 remain on the etch stop layer 260. In between adjacent stacks of bit lines 270, 290, the etch stop layer 260 may be temporarily exposed. The sacrificial layers 330 may be removed after patterning of the stacked layers, as illustrated, e.g., in FIG. 6A and FIG. 6B. After removal of the sacrificial layers 330, the insulating layers 320b may be exposed on top of the stacks of bit lines 270, 290.

Figure 7A:
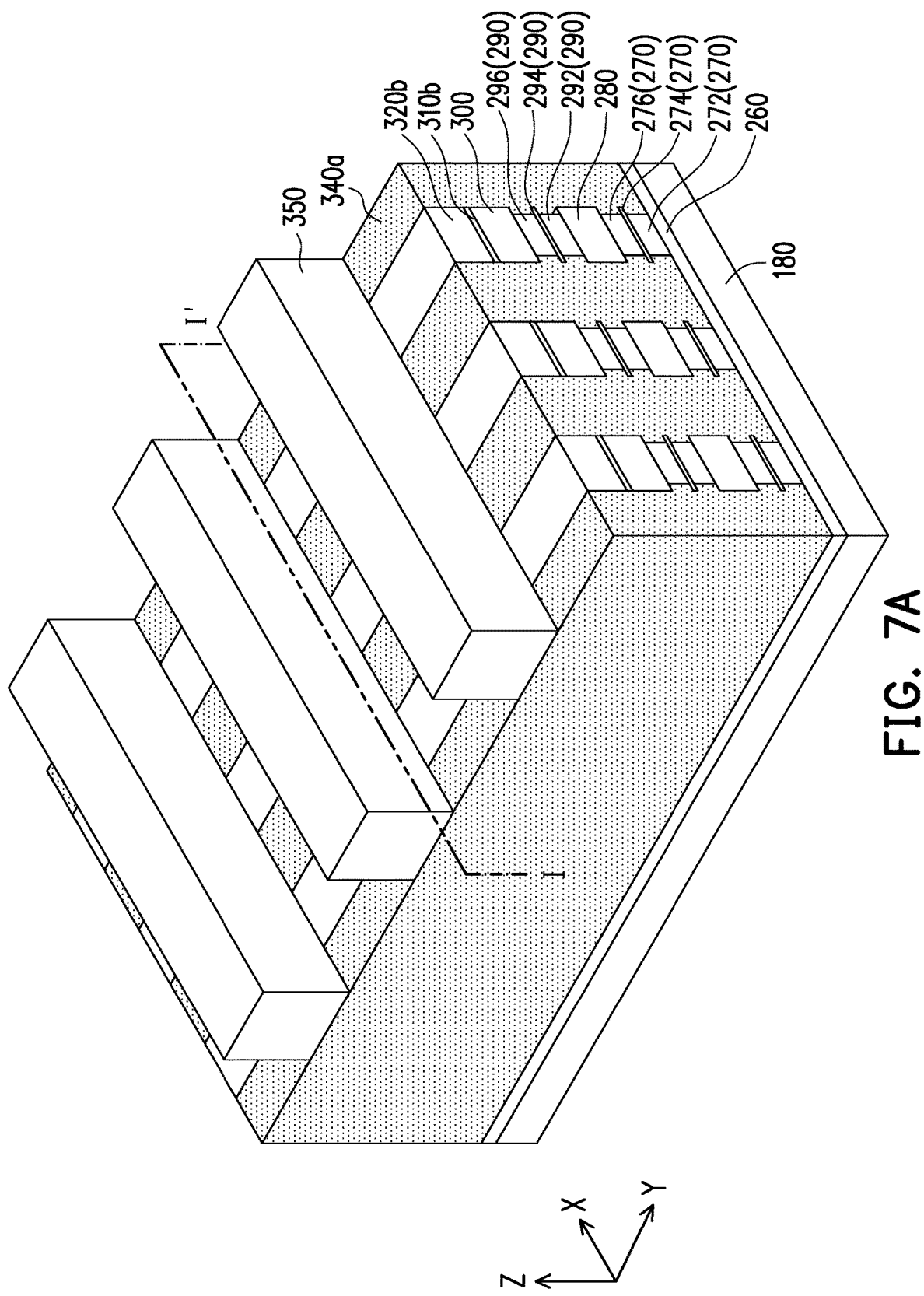
Figure 7B:
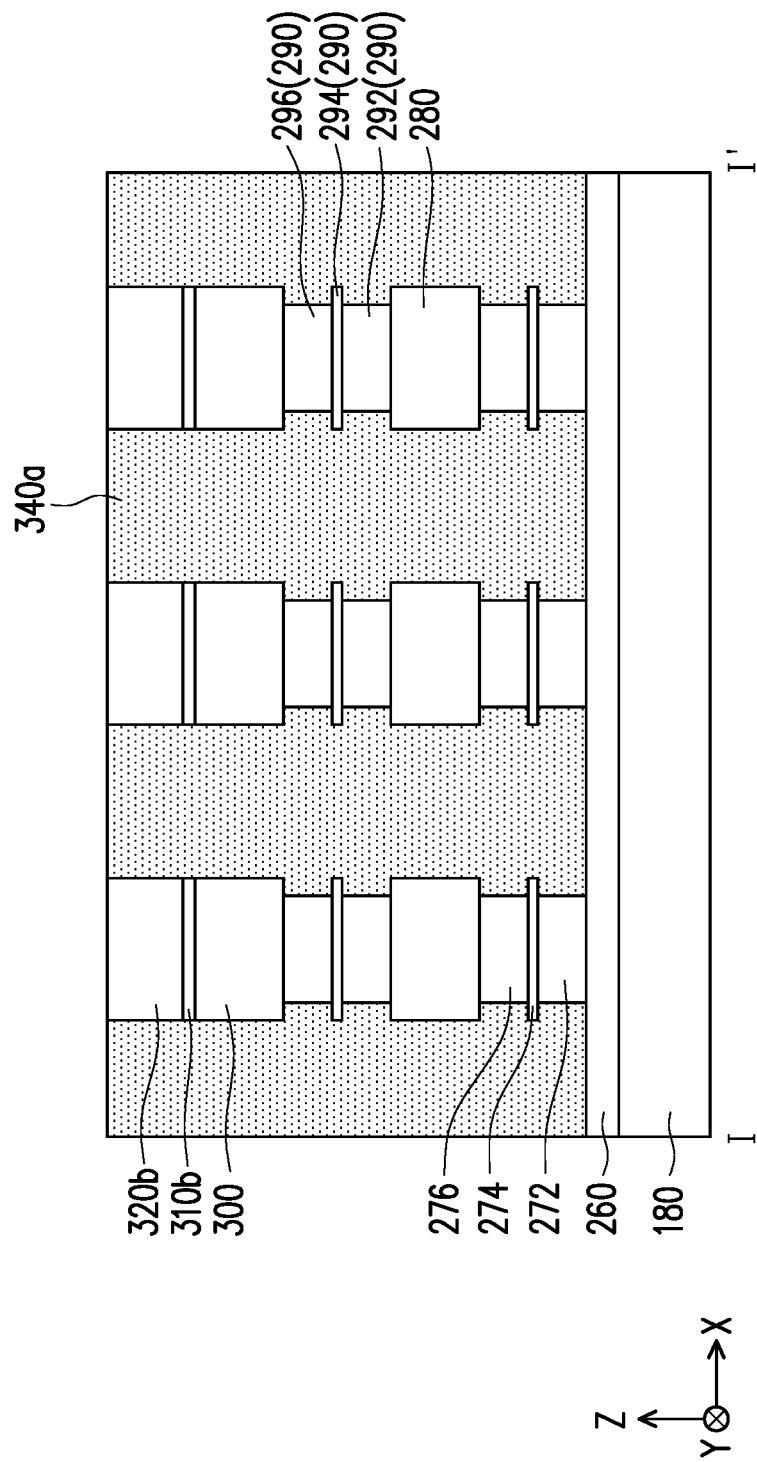

In FIG. 7A and FIG. 7B, isolation layers 340a are formed on the etch stop layer 260 in the spaces between the stacks of bit lines 270, 290. The isolation layers 340a may include an oxide insulating material, such as silicon oxide, silicon oxynitride, or a combination thereof. In some embodiments, the isolation layers 340a are formed as a single isolation layer (not shown) initially burying the stacks of bit lines 270, 290. The material of the isolation layers 340a may be formed via suitable deposition processes, such as ALD, CVD, or the like. The single isolation layer is then recessed so as to expose the insulating layers 320b on top of the stacks of bit lines 270, 290, leaving the isolation layers 340a in between adjacent stacks of bit lines 270, 290. The single isolation layer may be thinned via a planarization process, for example via grinding, chemical-mechanical polishing, or the like. After thinning, the isolation layers 340a fill the spaces in between the stacks of bit lines 270, 290, while top surfaces of the isolation layers 340a and the insulating layers 320b are substantially coplanar (at the same level height along the Z direction).

Hard mask patterns 350 are then formed on the stack of bit lines 270, 290 and the isolation layers 340a. The hard mask patterns 350 may be elongated strips extending parallel to each other along the X direction and disposed at a distance from each other along the Y direction. In some embodiments, the hard mask patterns 350 extend perpendicularly with respect to the bit lines 270, 290. Each hard mask pattern 350 may extend over multiple stacks of bit lines 270, 290. In some embodiments, the hard mark patterns 350 includes a different material than the isolation layers 340a, for example nitride insulating materials such as silicon nitride. In some embodiments, the material of the hard mask patterns 350 is selected so as to withstand etching conditions applied during later patterning of the isolation layers 340a. In some embodiments, the hard mask patterns 350 may be originally formed as a blanket layer via suitable deposition techniques, such as ALD, CVD, or the like, and then be patterned as elongated strips during an etching step employing one or more auxiliary masks (not shown).

Referring to FIG. 7A, FIG. 7B, FIG. 8A, and FIG. 8B, the pattern of the hard mask patterns 350 is transferred to the isolation layers 340a, the insulating layer 320b, and the pad layer 310b, thus leaving parallel isolation walls 345 extending across the stacks of bit lines 270, 290 at a distance from each other along the Y direction. In some embodiments, the isolation walls 345 includes portions of the isolation layers 340 filling the spaces between adjacent stacks of bit lines 270, 290, and portions of pad layers 310 and insulating layers 320 stacked on the insulating layers 300. Outside of the isolation walls 345, the insulating layers 300 are exposed at the top of the stacks of bit lines 270, 290, while the metal layers 272, 274, 276, 292, 294, 296 of the bit lines 270, 290 are exposed at the sides of the stacks, in spaces defined by adjacent isolation walls 345. The isolation layers 340 may conformally fill the recesses of the metal layers 272, 292 and metal layers 276, 296 of the bit lines 270, 290 between the metal layers 274, 294 and the insulating layers 280, 300 or the etch stop layer 260. The metal layers 274, 294 may protrude into the isolation layers 340 in correspondence of the isolation walls 345, to be received within indentations of the isolation layers 340. Protruding portions of the isolation layers 340 contact the metal layers 272, 292, and the metal layers 276, 296, and sandwich the protruding portions of the metal layers 274, 294. For example, between the insulating layer 280 and the etch stop layer 260, portions of the isolations layers 340 are alternately stacked with portions of the metal layers 274 in correspondence of the isolation walls 345.

Figure 8A:
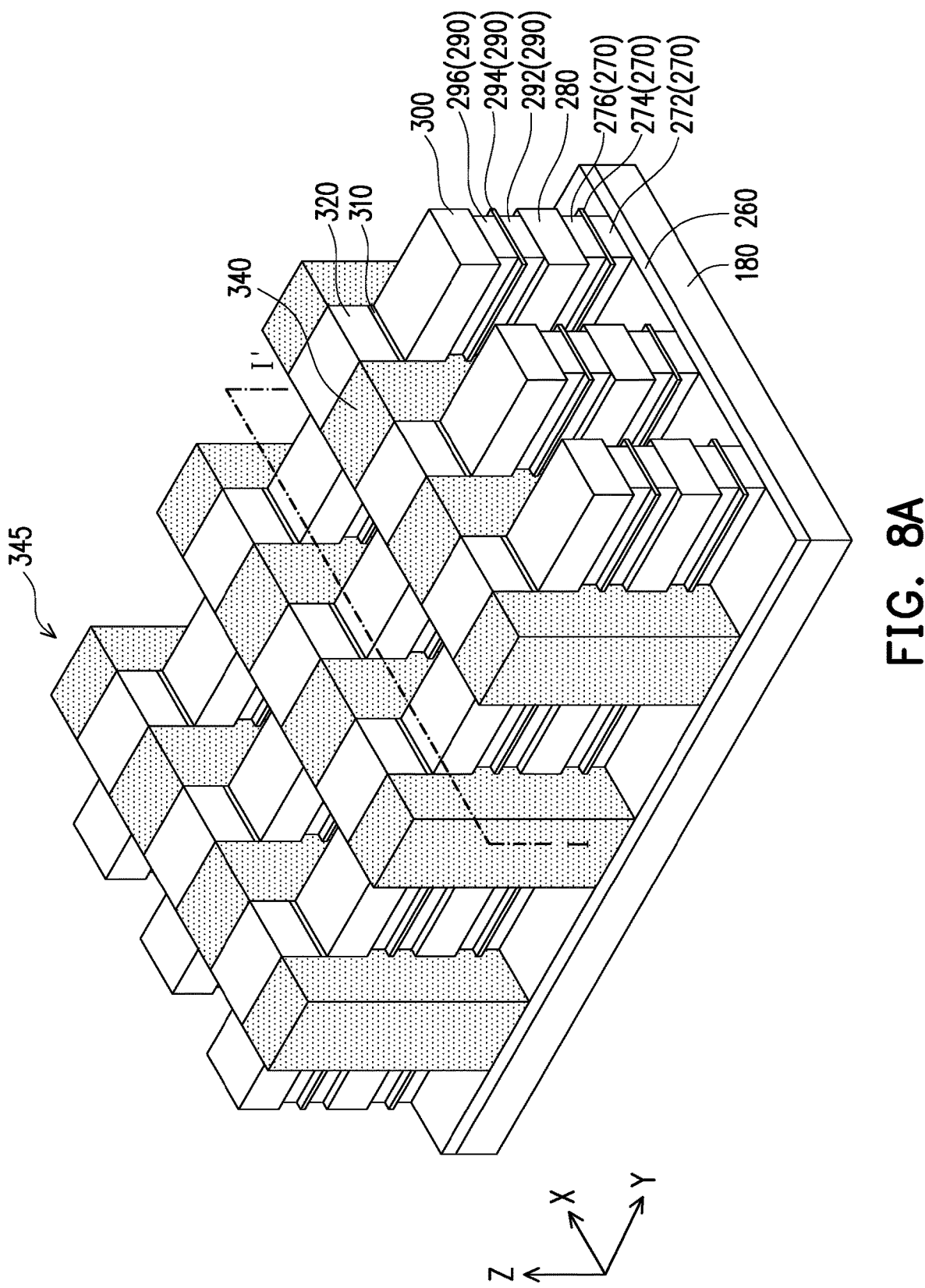
Figure 8B:
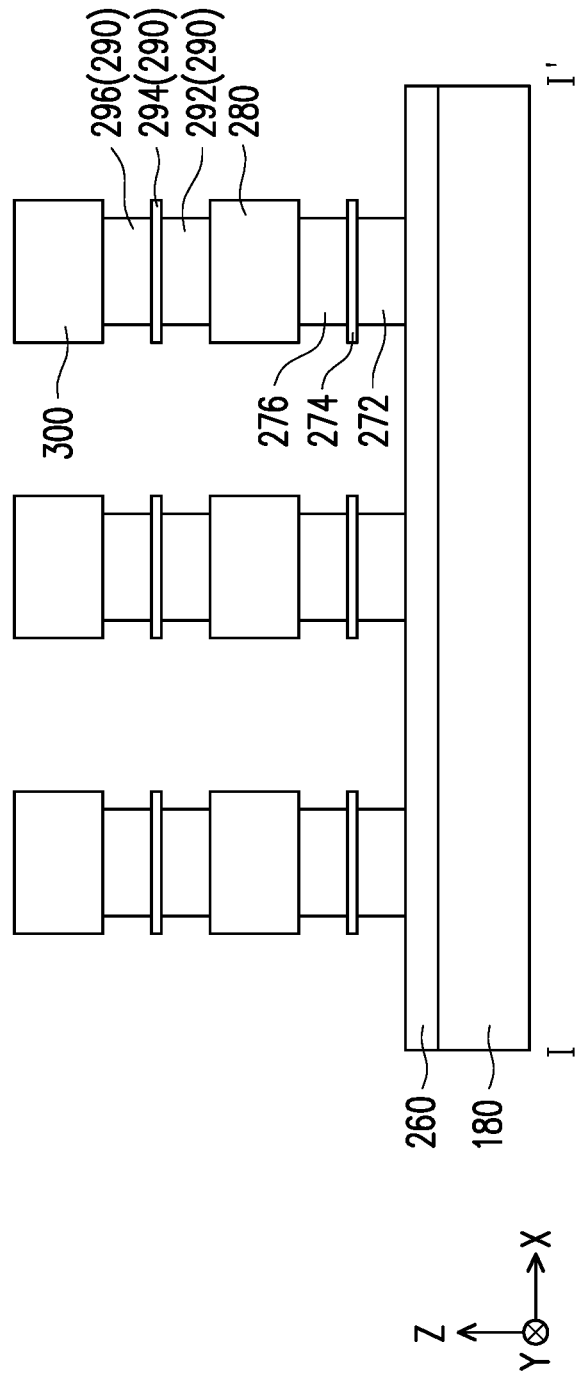
Figure 9A:
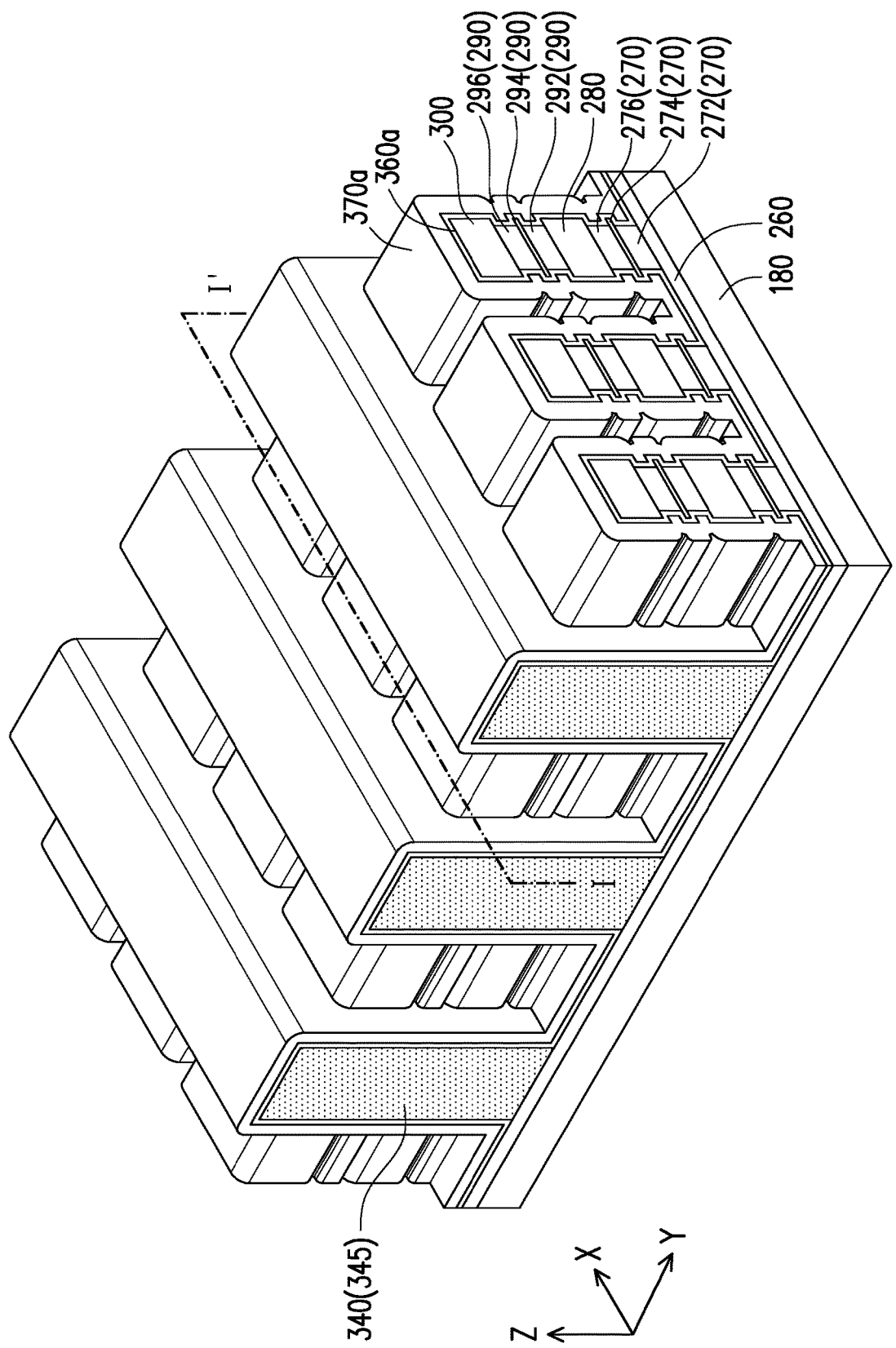
Figure 9B:
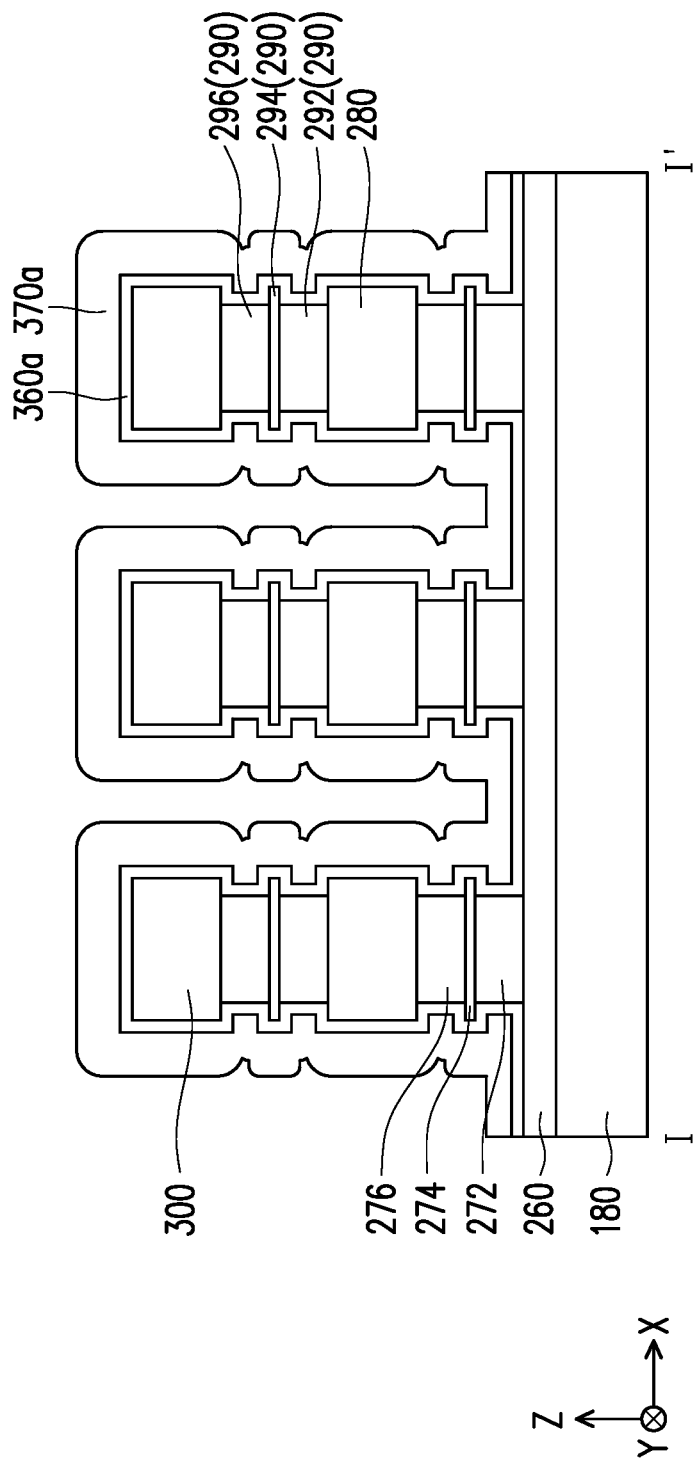

In FIG. 9A and FIG. 9B, a memory layer 360a and a selector layer 370a are blanketly and sequentially formed on the structure illustrated in FIG. 8A and FIG. 8B. The memory layer 360a includes a material that is capable of storing a bit, such as a material capable of switching between two different states having different resistance values by applying an appropriate voltage differential across the memory layer 360. For example, the state of the memory layer 360a may change due to an electric field resulting from applying a voltage differential. The material of the memory layer 360a is not particularly limited as long as it displays the resistance switch behavior, and may be a binary or higher oxide, a chalcogenide, a nitride, or the like. The material of the memory layer 360a may be deposited by suitable processes, such as ALD, CVD, or the like. The thickness of the memory layer 360a may be in the range from about 2 nm to about 10 nm, for example. The memory layer 360a may be deposited conformally over the stacks of bit lines 270, 290 and the isolation walls 345 (illustrated, e.g., in FIG. 8A). The memory layer 360 contacts the sides of the bit lines 270, 290 exposed in the spaces between isolation walls 345, and has a profile following the protrusion and recesses defined by the metal layers 272, 274, 276, 292, 294, 296 of the bit lines 270, 290.

In some embodiments, the selector layer 370a is conformally formed over the memory layer 360a. In some embodiments, the selector layer 370a includes a selector material which is a switching material, capable of switching between an ON and an OFF state according to an applied voltage or current. For example, once a threshold voltage is applied or a threshold current runs through the selector material, the selector material is turned ON, and exists in a conductive state. When the voltage or current falls below the threshold value, the selector material is turned OFF. In some embodiments, the selector layer 370a helps to reduce or prevent parasitic current paths within the array of memory cells, reducing the possibility that non-selected memory cells may be addressed in place of the intended ones. In some embodiments, the behavior of the selector layer 370a is chiefly determined by the nature of the material included. In some embodiments, the selector layer 370a includes GeSe, AsGeSe, and/or AsGeSeSi, optionally doped with one or more of N, P, S, Si, and Te. In some embodiments, the selector layer 370a includes non-stoichiometric oxides, such as silicon oxide, titanium oxide, aluminum oxide, tungsten oxide, titanium nitride oxide, hafnium oxide, tantalum oxide, niobium oxide or the like. In some embodiments, the selector layer 370a includes a chalcogenide including one or more of Ge, Sb, S, and Te. The selector layer 370a may be formed by suitable deposition processes, such as ALD, CVD, or the like. In some embodiments, the thickness of the selector layer is in the range from about 5 nm to about 20 nm.

Figure 10A:
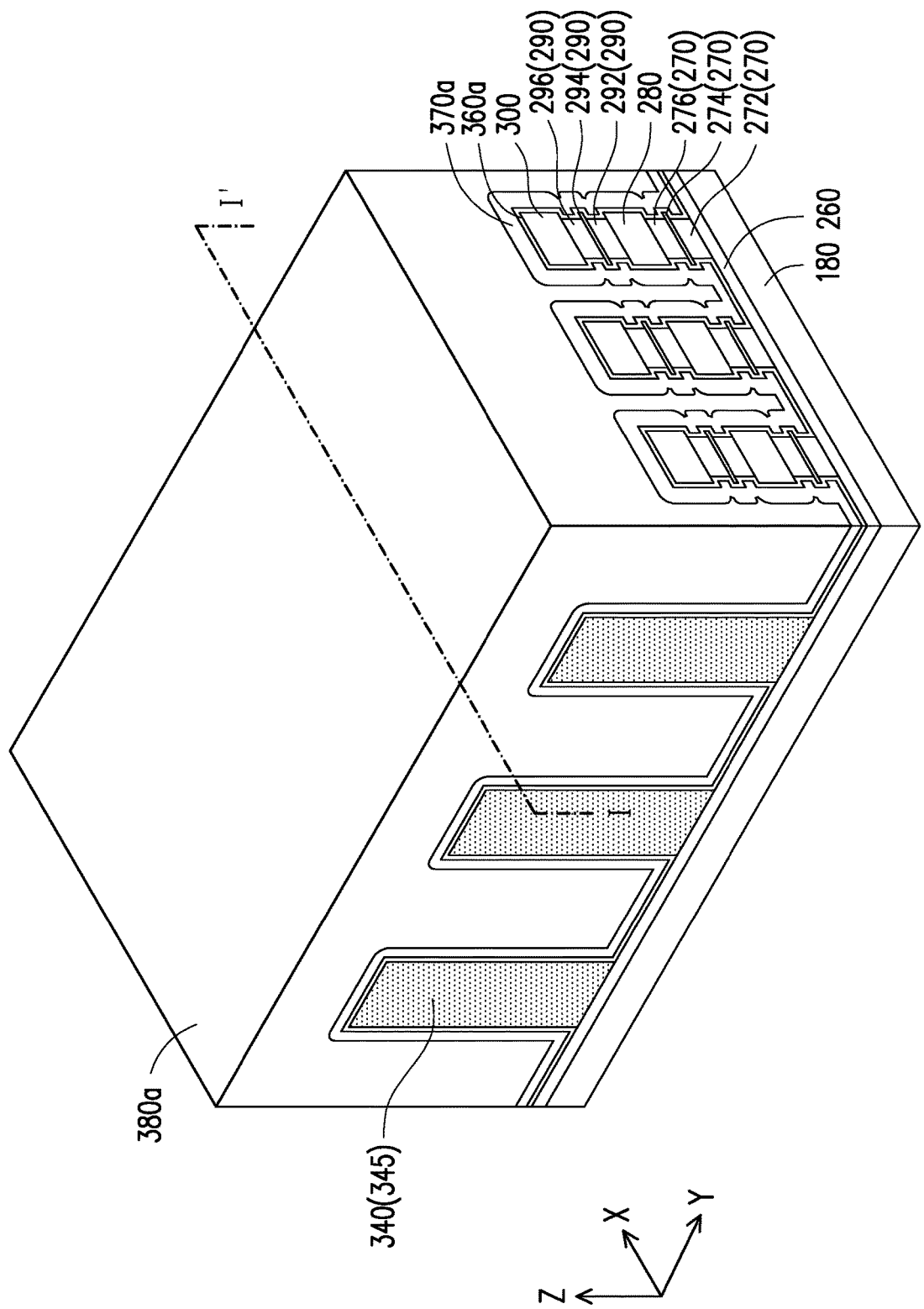
Figure 10B:
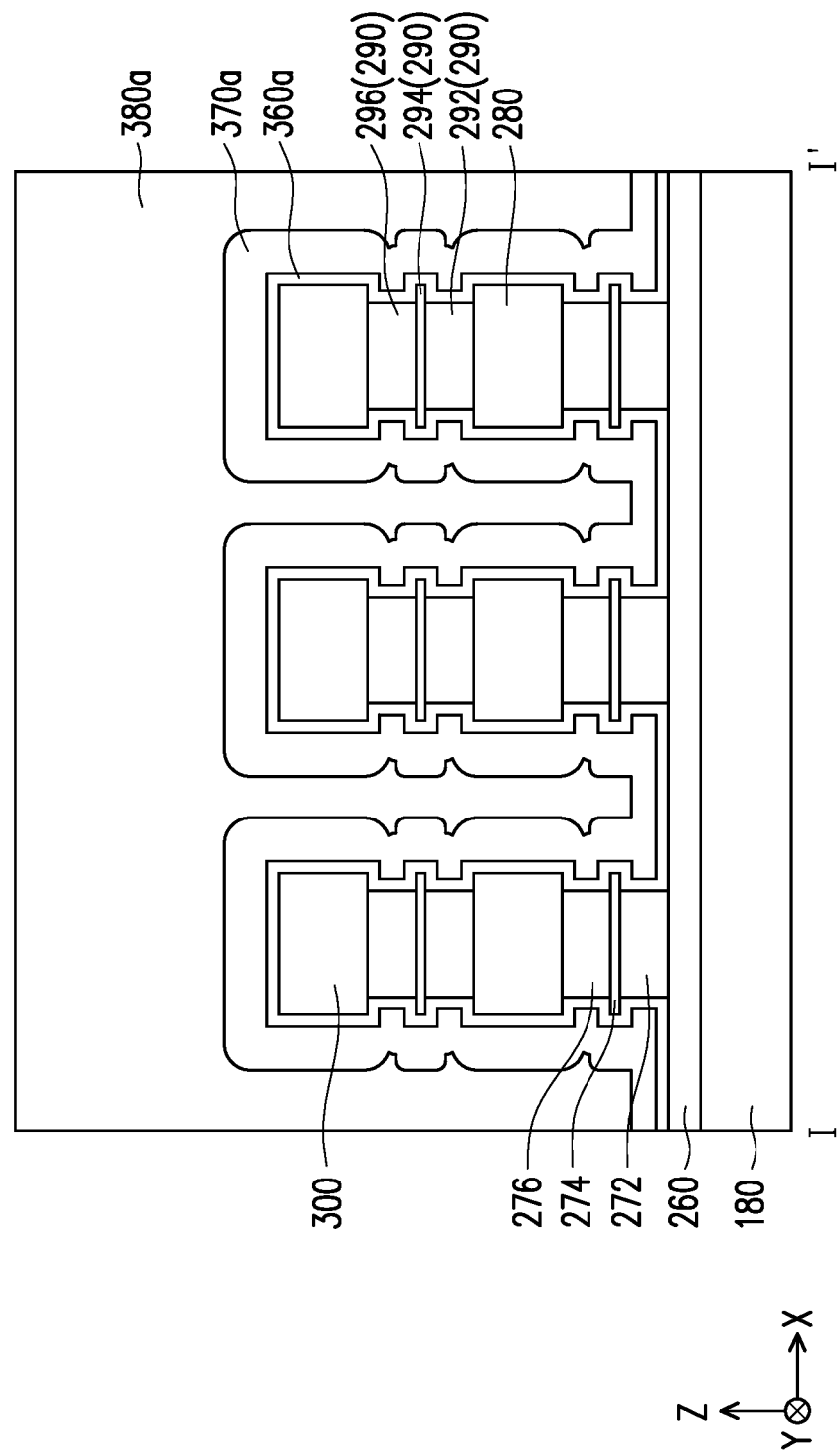
Figure 11A:
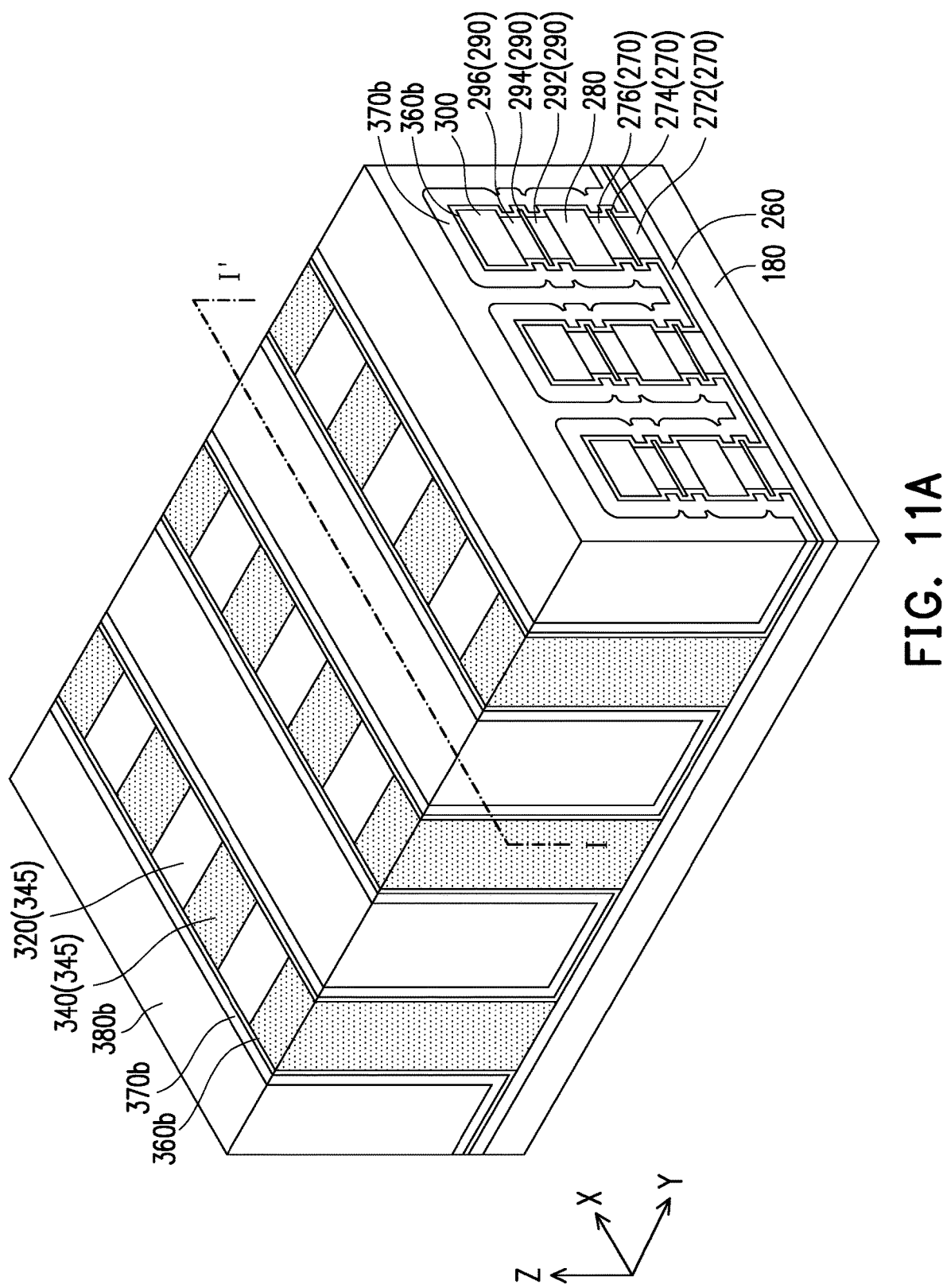
Figure 11B:
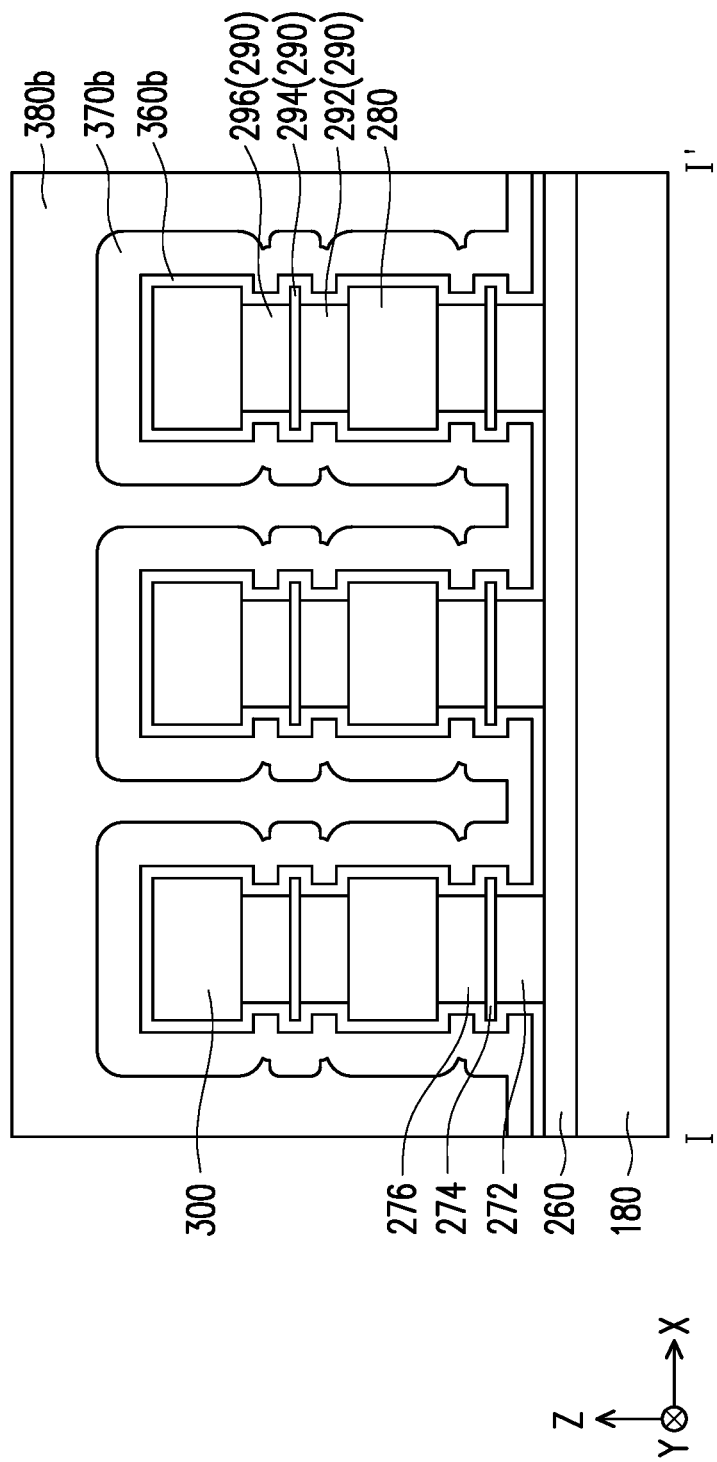

In FIG. 10A and FIG. 10B, a word metal layer 380a is formed over the selector layer 370a, so as to bury the structure of FIG. 9A and FIG. 9B, filling the spaces between stacked bit lines 270, 290, and isolation walls 345. The word metal layer 380a may include any suitable conductive material, such as, for example, tungsten (W), cobalt (Co), nickel (Ni), copper (Cu), aluminum (Al), titanium (Ti), tantalum (Ta), alloys thereof, silicides thereof, or a combination thereof. In some embodiments, the word metal layer 380a includes tungsten. The word metal layer 380a may be formed by any suitable process, such as ALD, CVD, electroplating, or the like.

Referring to FIG. 10A, FIG. 10B, FIG. 11A and FIG. 11B, a planarization process such as grinding or chemical-mechanical polishing is performed to remove portions of the word metal layer 380a, the selector layer 370a, and the memory layer 360a until top surfaces of the isolation walls 345 are exposed. For example, following the planarization of the word metal layer 380a, the isolation layers 340 and the insulating layers 320 may be once again exposed, and word metal layers 380b may extend in between adjacent isolation walls 345. The word metal layers 380b extend along the X direction perpendicular to the bit lines 270, 290, so that each word metal layer 380b contacts multiple stacks of bit lines 270, 290, and each bit line 270, 290 contacts multiple word metal layers 380b. The memory layers 360b and the selector layers 370b remain between the word metal layers 380b and the insulation walls 345, as well as between the word metal layers 380b and the bit lines 270, 290.

Figure 12A:
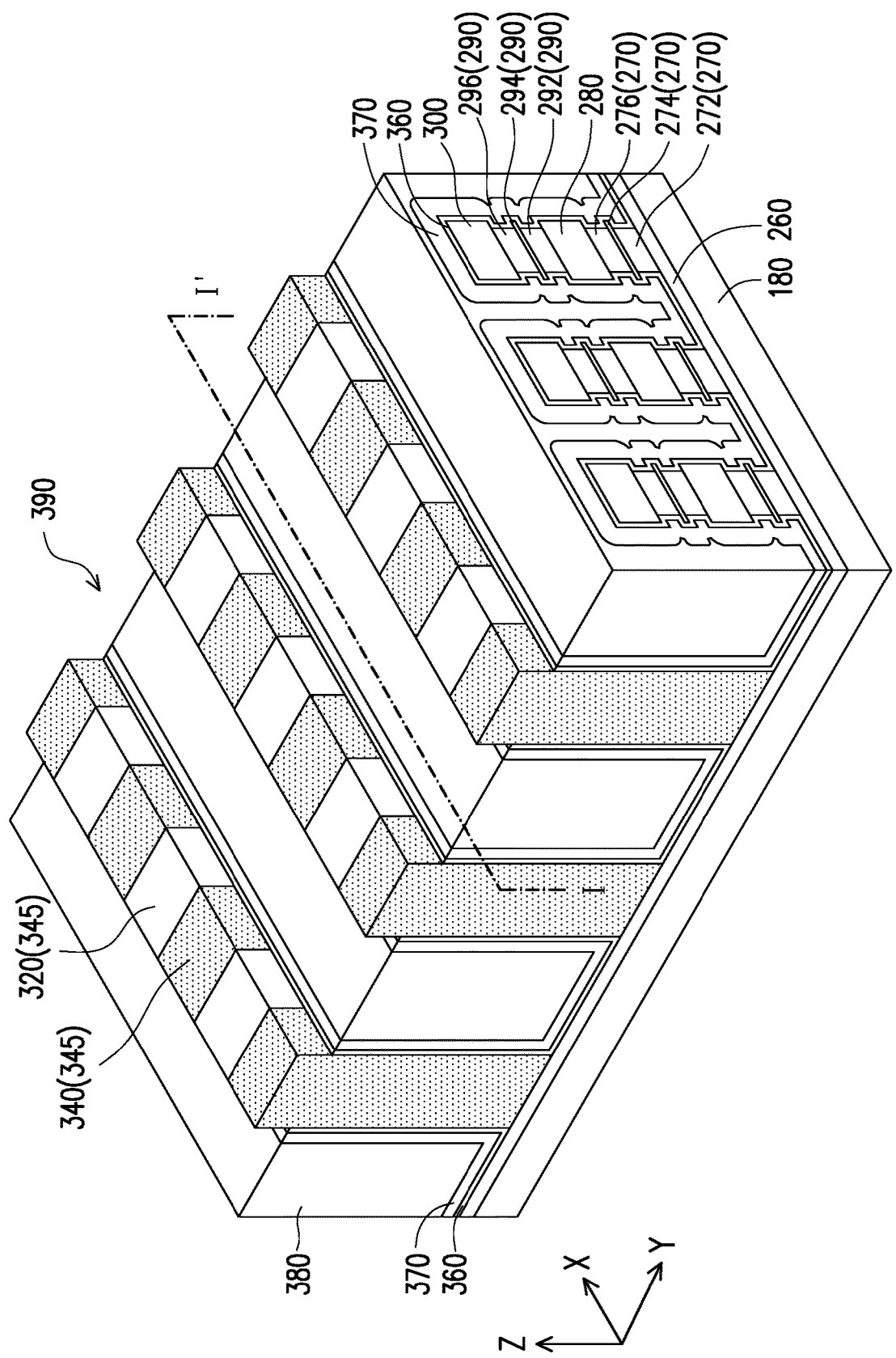
Figure 12B:
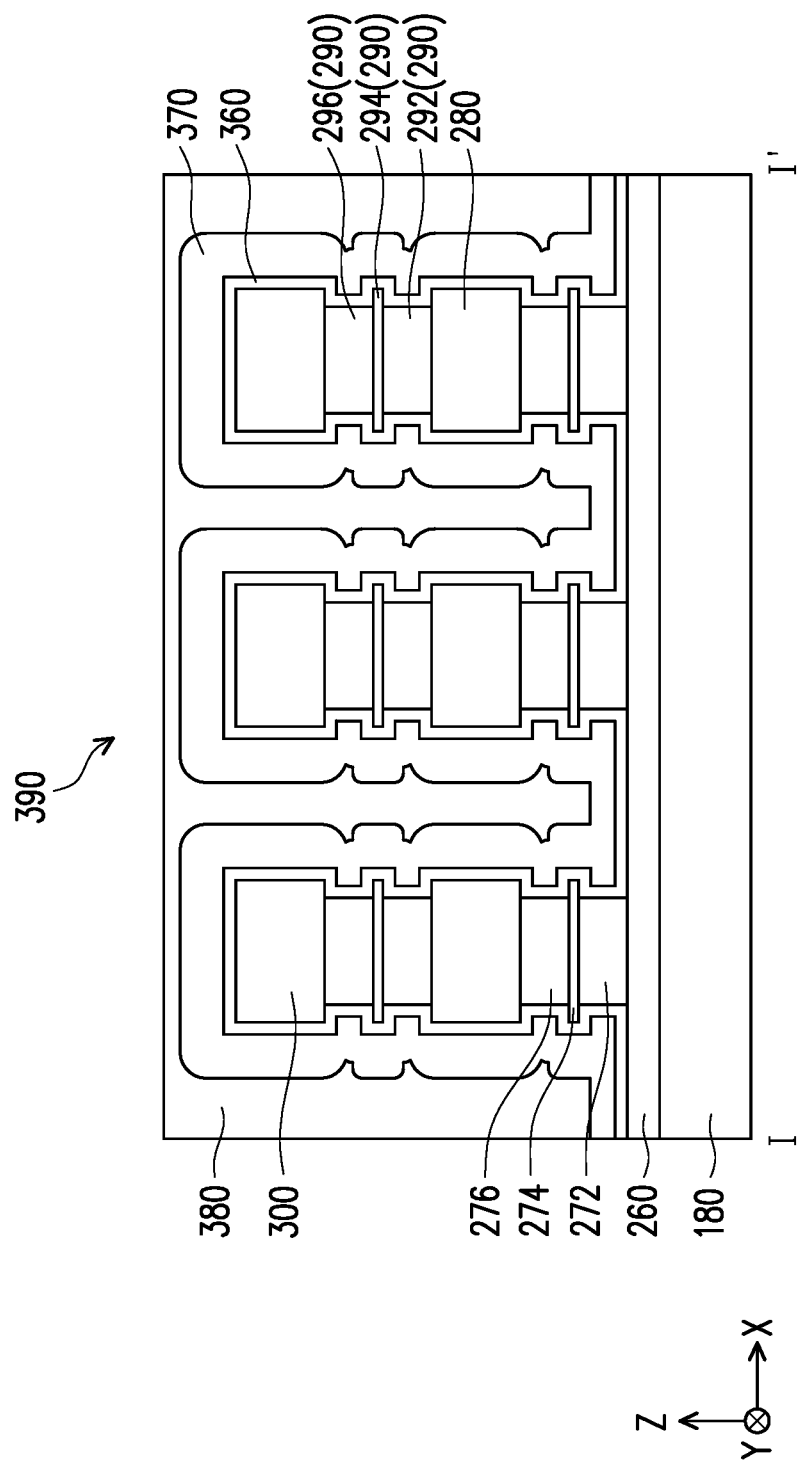

In FIG. 12A and FIG. 12B, the word metal layers 380, the selector layers 370, and the memory layers 360 have been recessed along the Z direction with respect to the isolation walls 345. For example, one or more selective etching steps may be performed to form recesses 390 on top of the word metal layers 380 in between the isolation walls 345. The recesses 390 extends along the X direction, and at their bottom are exposed the word metal layers 380, the selector layers 370, and the memory layers 360. In some embodiments, the depth of the recesses 390 may be controlled by selection of the etching conditions, such as the duration of the etching steps. In some embodiments, side surfaces of the portions of isolation layers 340 and the insulating layers 320 may be exposed along the sidewalls of the recesses 390.

Figure 13A:
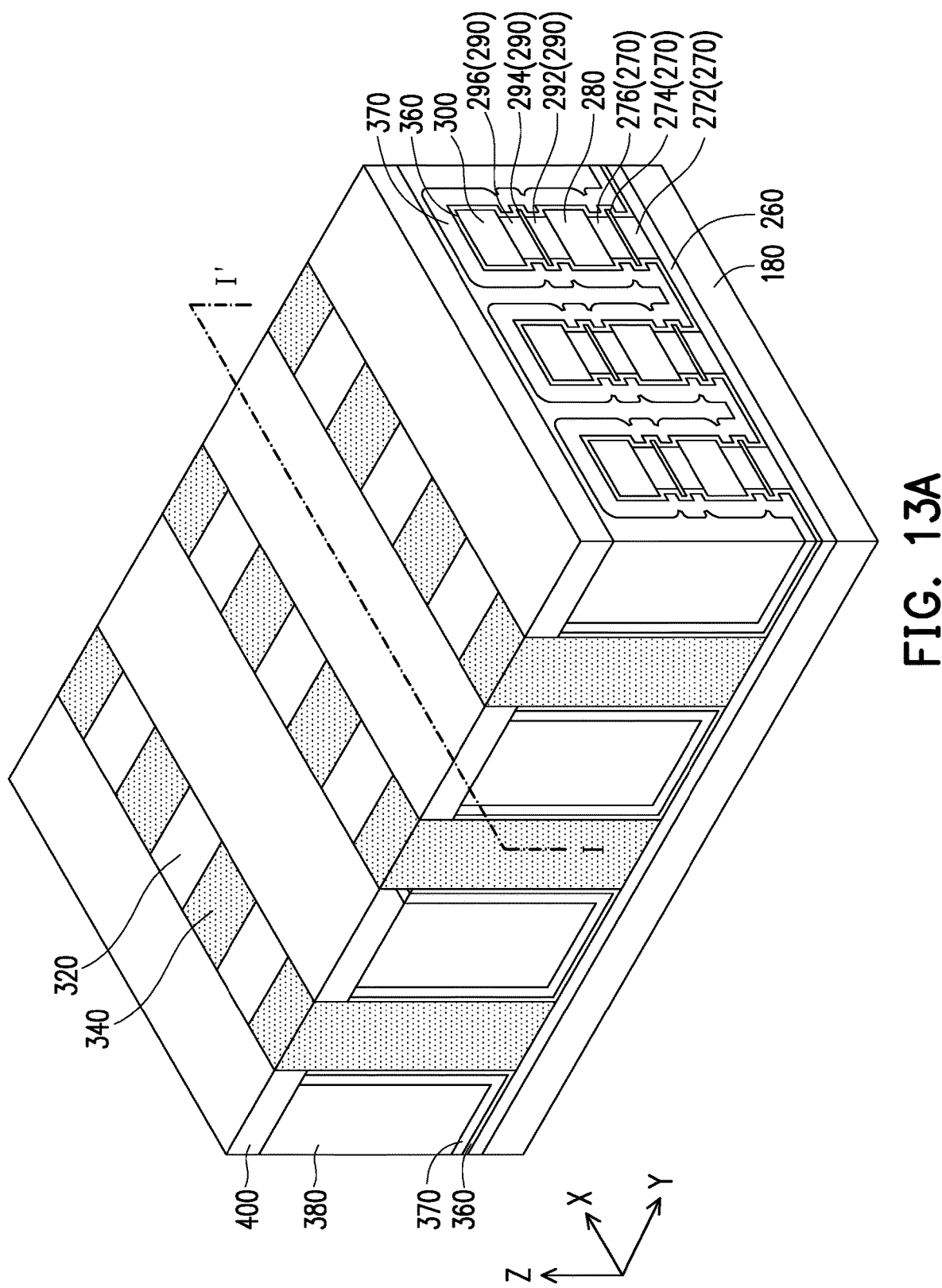
Figure 13B:
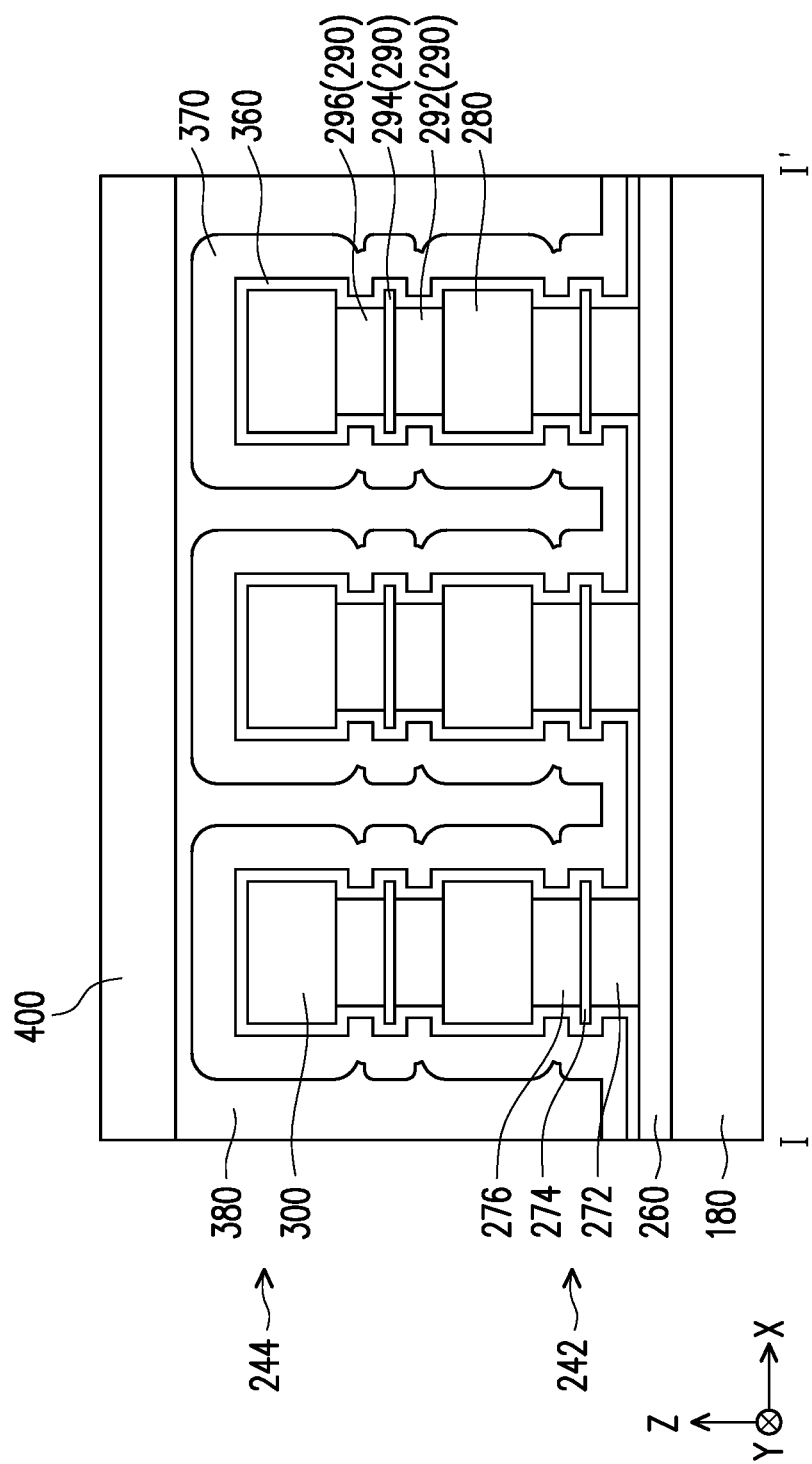

In FIG. 13A and FIG. 13B, additional metal layers 400 are formed in the recesses 390 (illustrated, e.g., in FIG. 12A), to form together with the word metal layers 380, T-shaped word lines (380+400). In some embodiments, the additional metal layers 400 include the same material as the word metal layers 380. In some alternative embodiments, the additional metal layers 400 include a different material than the word metal layers 380. With the formation of the additional metal layers 400, the memory array 240a is formed. In some embodiments, the memory array 240a includes two layers of memory cells 242, 244 each having their dedicated bit lines (e.g., the bit lines 270 for the memory cells 242 and the bit lines 290 for the memory cells 244) stacked over each other and contacted by the same word metal layers 380. Individual memory cells 242, 244 may be selected by unique combinations of word metal layers 280 and bit lines 270, 290.

Figure 14:
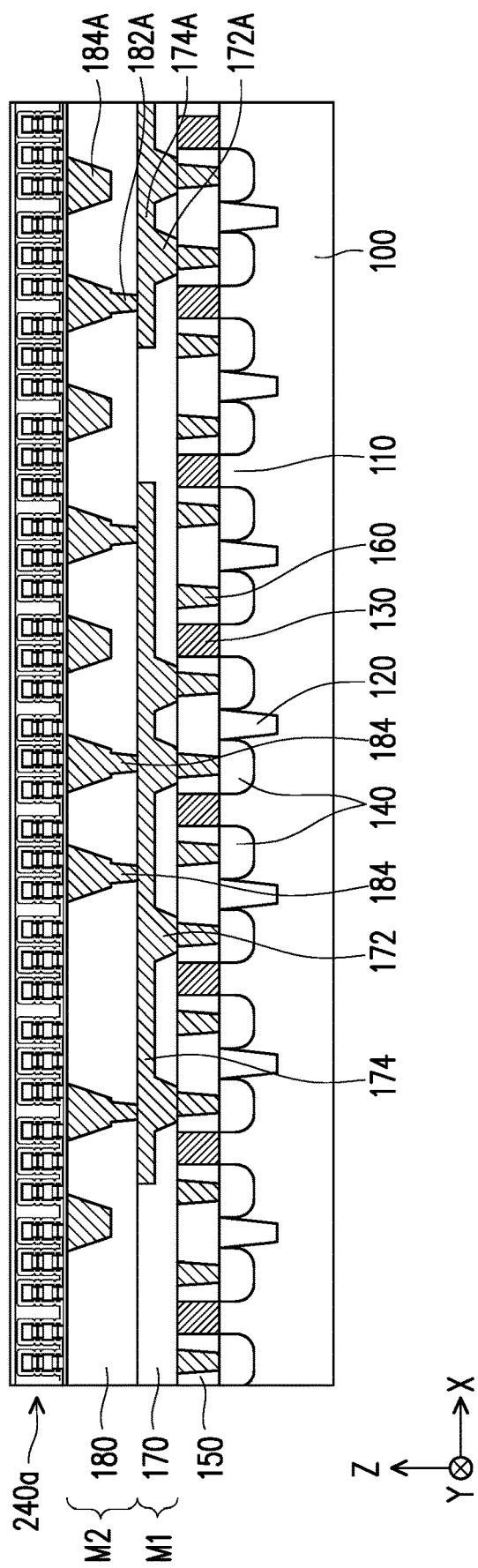
FIG. 14 to FIG. 19 are schematic cross-sectional views of structures formed during a manufacturing process of a semiconductor device in accordance with some embodiments of the disclosure.
Figure 15:
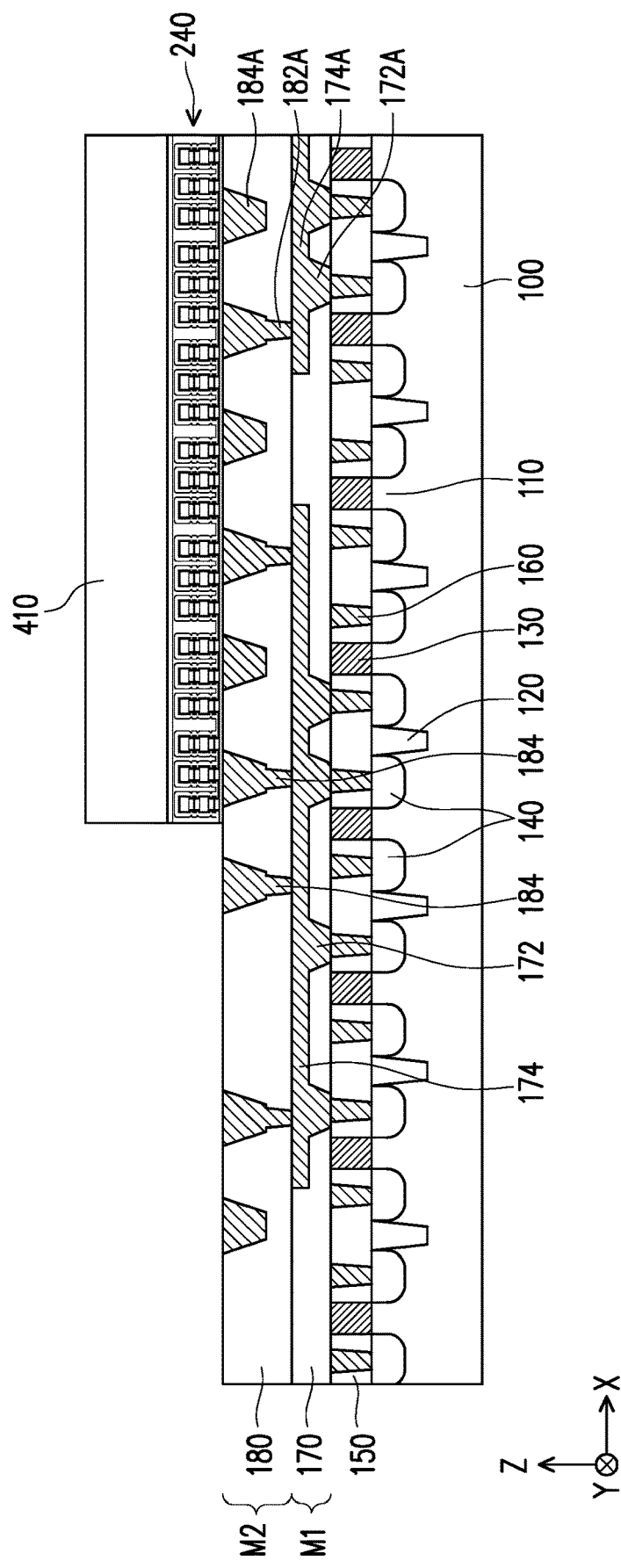

FIG. 14 to FIG. 19 are schematic cross-sectional views taken in the same plane as FIG. 1 to FIG. 3. In FIG. 14, it is shown that the memory array 240a may be disposed on the metallization level M2, and may initially cover most if not all of the metallization level M2. Referring to FIG. 14 and FIG. 15, in some embodiments a mask layer 410 is formed on part of the memory array 240a, and the part of the memory array 240a left exposed by the mask layer 410 is removed, for example by suitable etching processes, to expose once again the metallization level M2. After etching, the memory array 240 remains in the region covered by the mask layer 410, which mask layer 410 is subsequently removed. In some embodiments, the mask layer 410 may include a photoresist material, and be formed through a sequence of deposition, exposure, and developing steps.

Figure 16:
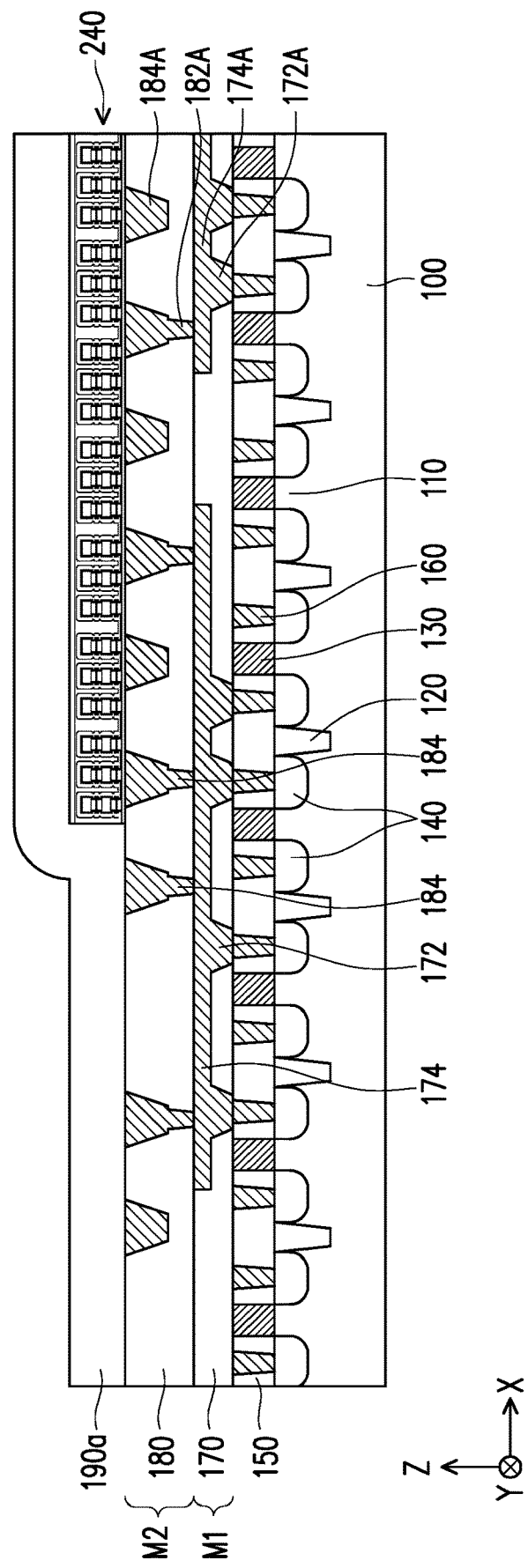
Figure 17:
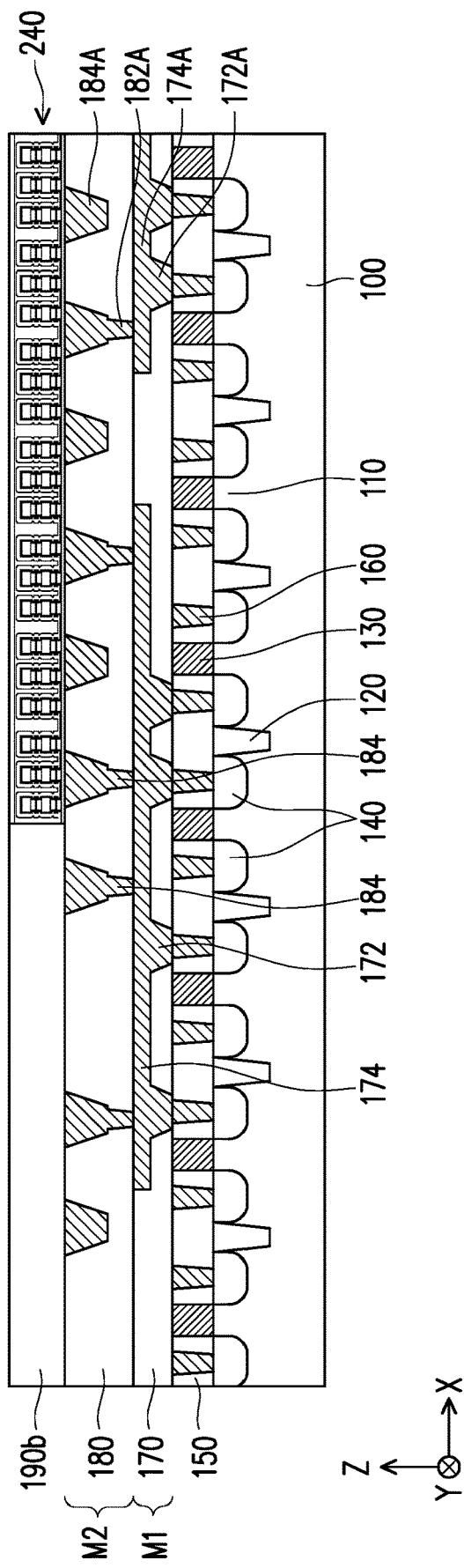
Figure 18:
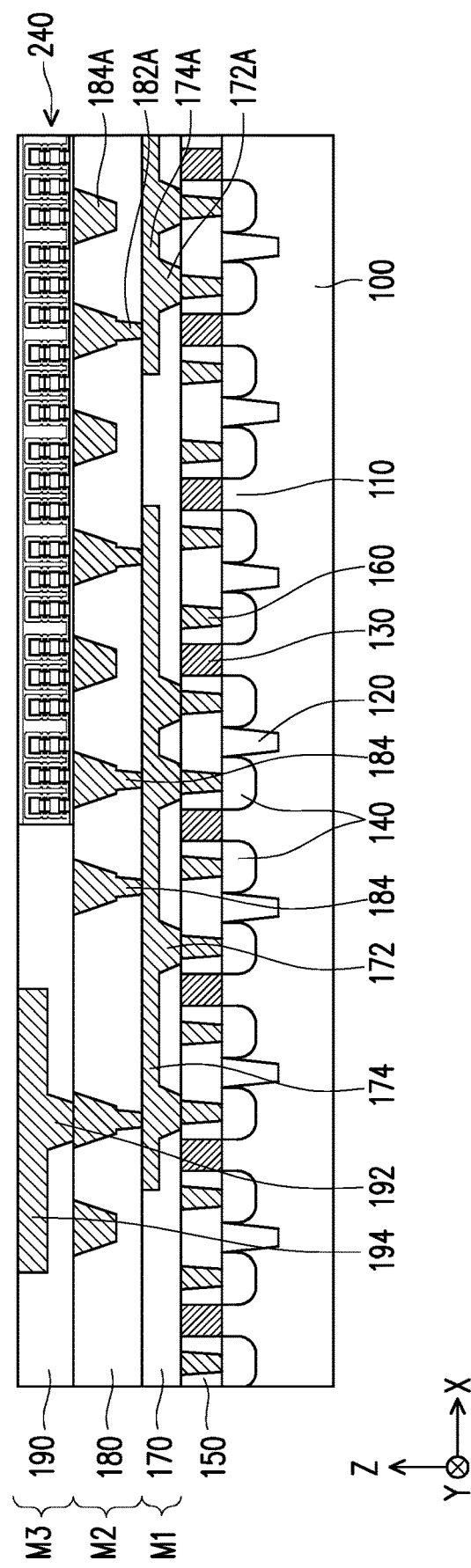

In FIG. 16, the ILD layer 190a is blanketly formed on the exposed portion of the metallization level M2 and on the memory array 240. Materials and processes to form the ILD layer 190a may be selected from the same options previously described for the dielectric layer 150. Referring to FIG. 16 and FIG. 17, the ILD layer 190b has been obtained by planarizing the ILD layer 190a until the memory array 240 is once again exposed. Planarization of the ILD layer 190a may be performed through any suitable process, such as grinding, chemical mechanical polish, or the like. In FIG. 18, the routing vias 192 and the routing traces 194 are formed in the ILD layer 190, for example via single or dual damascene process.

Figure 19:
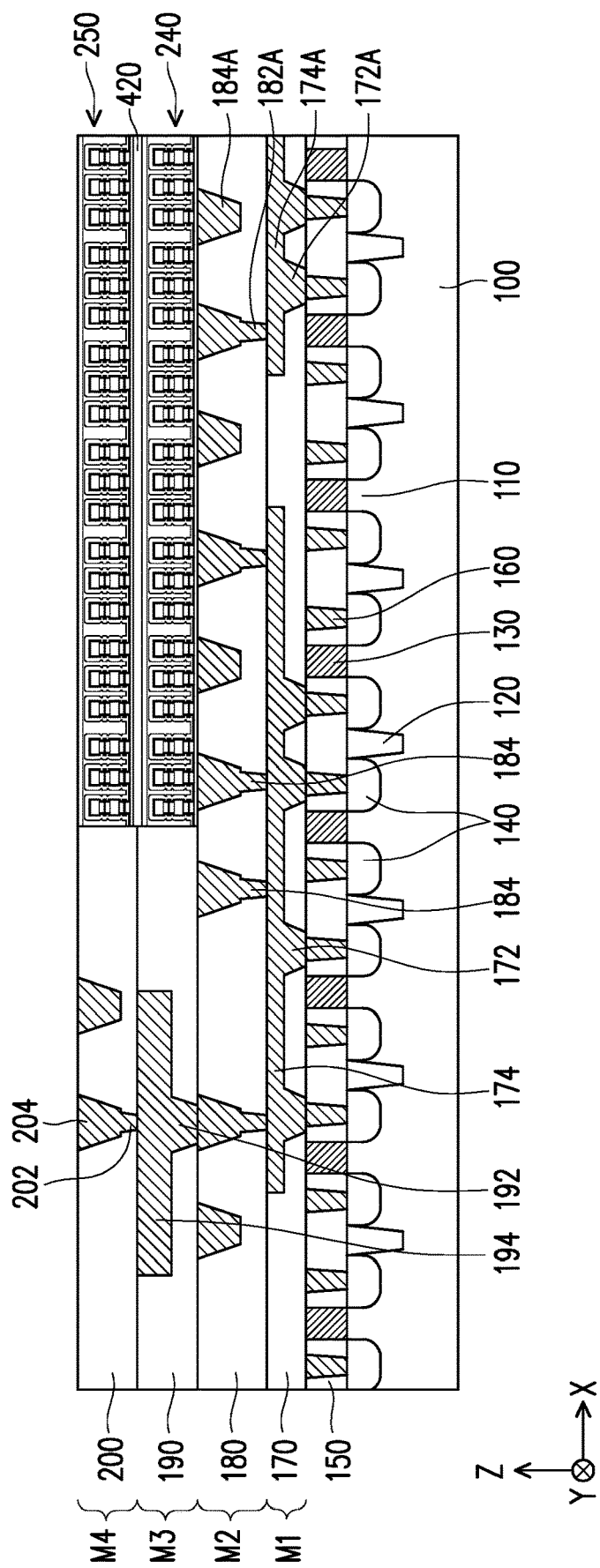

In FIG. 19, the operations described with reference from FIG. 4 to FIG. 19 may be repeated for a desired number of times to form additional memory arrays. For example, the memory array 250 having a similar structure to the memory array 240 is formed in the metallization level M4 according to the process described above, and then the ILD layer 200, the routing vias 202, and the routing traces 204 are formed beside the memory array 250. The semiconductor device SD10 of FIG. 1 may be obtained from the structure illustrated in FIG. 19 by forming the desired number of upper metallization levels (e.g., the metallization levels M5-M7 illustrated in FIG. 1), following similar processes as previously described with respect to the metallization levels M1 and M2, for example.

FIG. 20 to FIG. 24 are schematic cross-sectional views of portions of memory arrays of some semiconductor devices according to some embodiments of the disclosure. The views of FIG. 20 to FIG. 24 are taken in an XZ plane corresponding to the XZ plane of the views of FIG. 5B to FIG. 13B. In the description below of FIG. 20 to FIG. 24, identical reference numerals between different embodiments indicate that the descriptions provided above for the corresponding elements equally apply to the embodiments being described.

Figure 20:
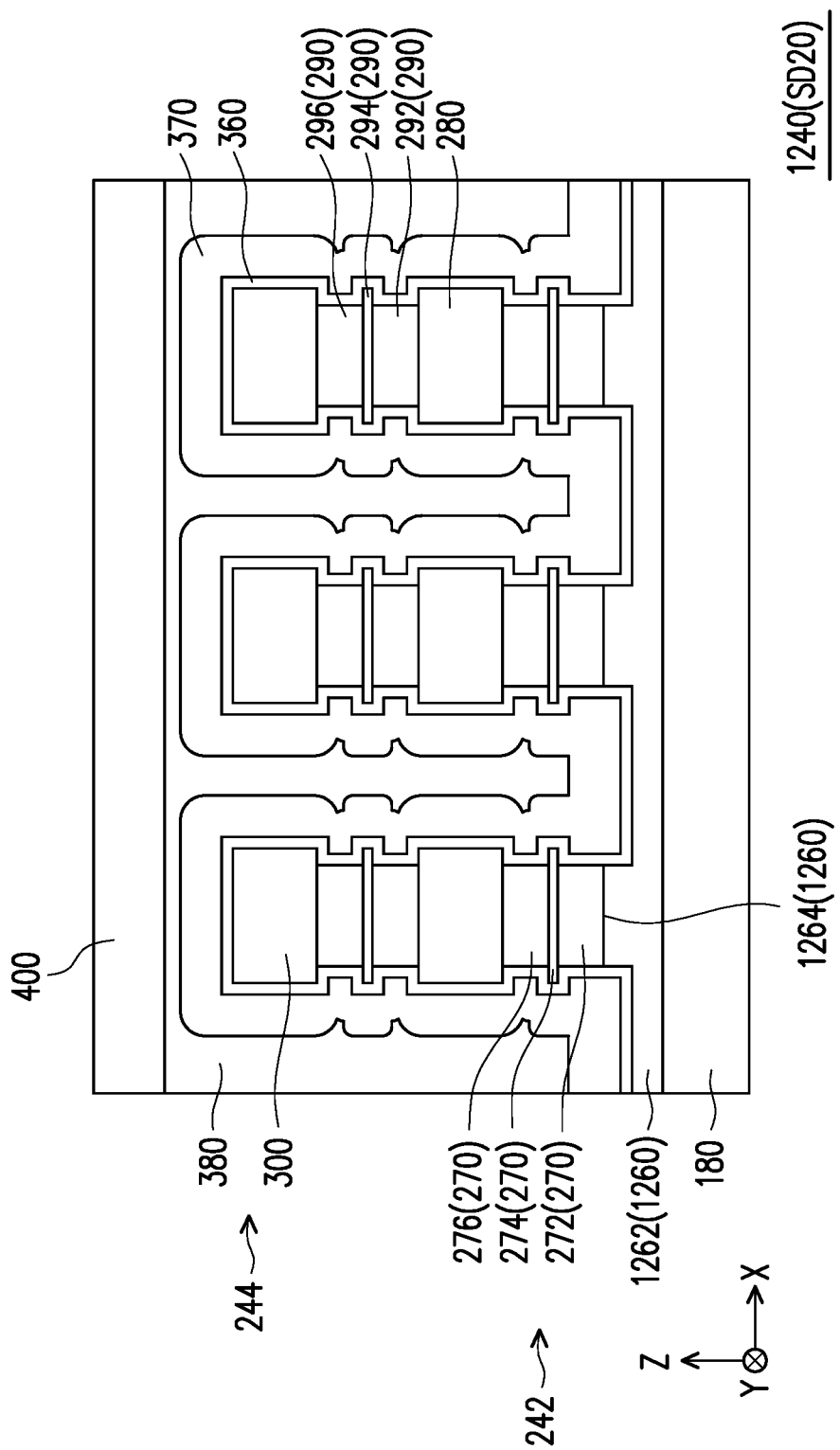
FIG. 20 to FIG. 24 are schematic cross-sectional views of memory arrays according to some embodiments of the disclosure.

In FIG. 20 is illustrated a portion of a memory array 1240 of a semiconductor device SD20 according to some embodiments of the disclosure. A difference between the memory array 1240 and the memory array 240a of FIG. 13B lies in that some back-etching of the etch stop layer 1260 took place while defining the bit lines 270 and 290 in the step previously described with reference to FIG. 5A and FIG. 5B, so that the etch stop layer 1260 includes a base portion 1262 blanketly extending on the ILD layer 180 and pedestal portions 1264 protruding from the base portion 1262 in correspondence of the bit lines 270. The width along the X direction of the pedestal portions 1264 may be substantially the same as the overlying metal layers 272.

Figure 21:
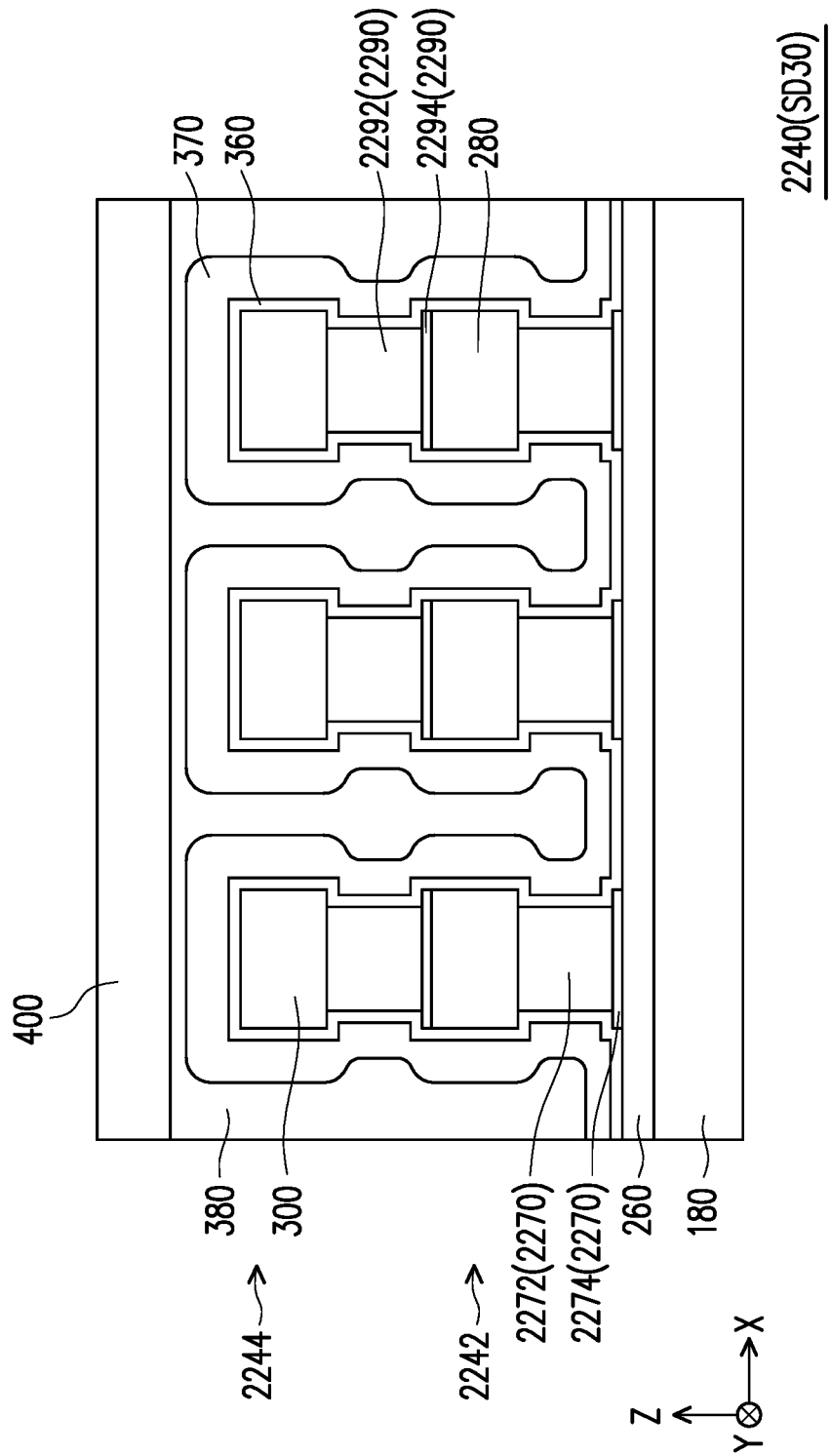

In FIG. 21 is illustrated a portion of a memory array 2240 of a semiconductor device SD30 according to some embodiments of the disclosure. A difference between the memory array 2240 and the memory array 240a of FIG. 13B lies in the structure of the bit lines 2270 and 2290. In some embodiments, the bit lines 2270, 2290 include two metal layers 2272, 2274 and 2292, 2294, respectively. The metal layers 2272, 2292 may be formed selecting material and processes from the options previously described with reference to the metal layers 272, 292 illustrated in FIG. 5A, and the metal layers 2274, 2294 may be formed selecting material and processes from the options previously described for the metal layers 274, 294. Taking as an example a bit line 2270, in some embodiments the bit line 2270 includes two metal layers 2272, 2274 having different (electric) resistance, with the resistance of the metal layer 2274 being smaller than the resistance of the metal layer 2272. The metal layer 2272 may be thicker than the metal layer 2274. For example, a ratio of the thickness of the metal layer 2272 to the thickness of the metal layer 2274 may be in the range from 20:1 to 1:1, such as in the range from 10:1 to 5:1. In some embodiments, the metal layer 2274 laterally protrudes with respect to the metal layer 2272, and is disposed closer to the etch stop layer 260 than the metal layer 2272. In other words, the bit lines 2270 of the memory cells 2242 of the memory array 2240 include the metal layers 2274 disposed on the etch stop layer 260, and the metal layers 2272 disposed on the metal layers 2274. Similarly, the bit lines 2290 of the memory cells 2244 include the metal layers 2294 disposed on the insulating layers 280, and the metal layers 2292 disposed on the metal layers 2294. In some embodiments, the resistivity of the material of the metal layers 2294 is lower than the resistivity of the material of the metal layers 2292. In some embodiments, manufacturing of the memory array 2240 may require forming fewer layers than what is illustrated in FIG. 4. The presence of the metal layers 2274, 2294 however, still allows for finer control of the electric field, to enable operation of the memory array 2240 as filamentary RRAM.

Figure 22:
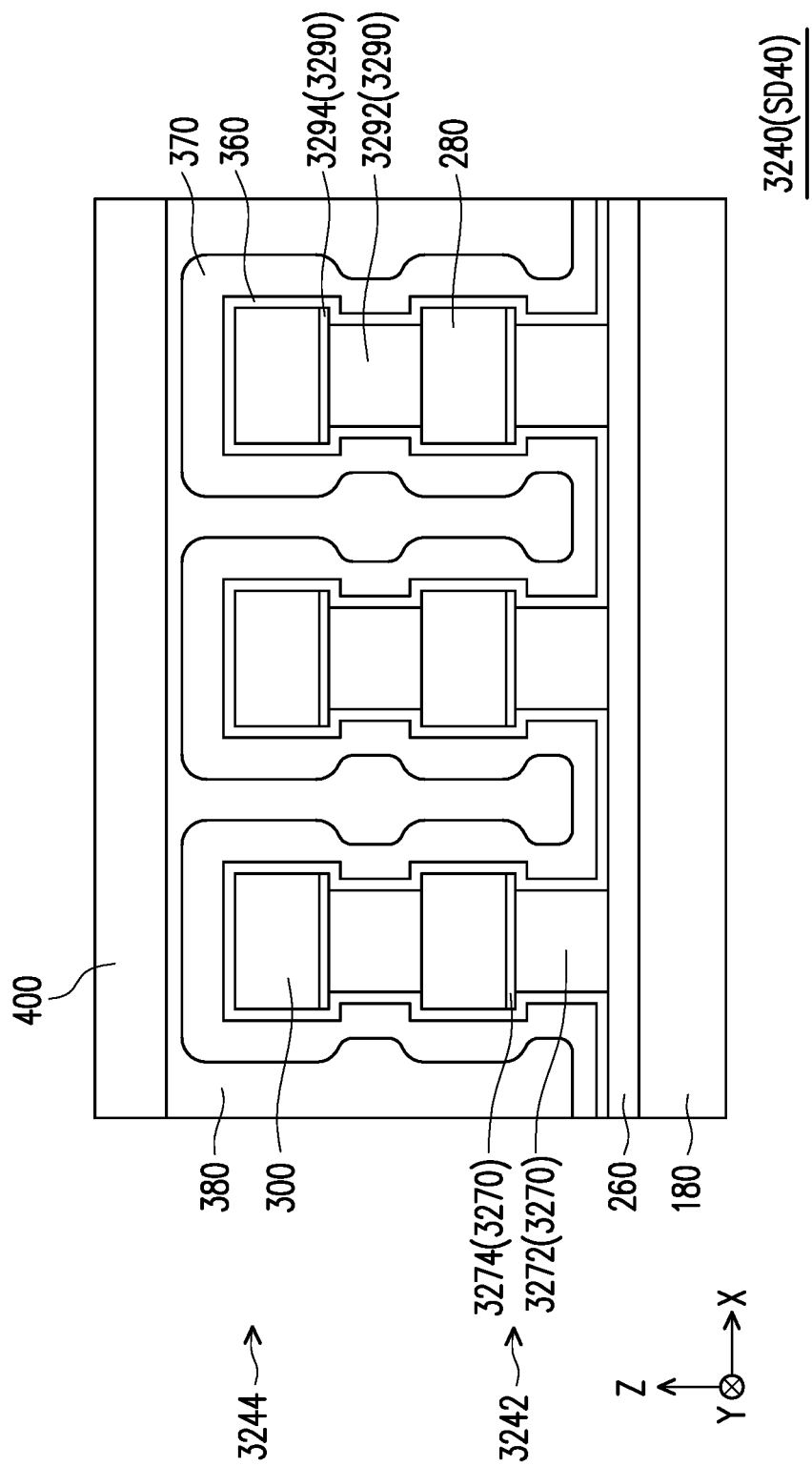

In FIG. 22 is illustrated a portion of a memory array 3240 of a semiconductor device SD40 according to some embodiments of the disclosure. A difference between the memory array 3240 and the memory array 2240 of FIG. 21 lies in the structure of the bit lines 3270 and 3290 of the memory cells 3242 and 3244. That is, in the bit lines 3270 and 3290, (thicker) metal layers 3272, 3292 are disposed below (thinner) metal layers 3274, 3294, with the metal layers 3272, 3292 being disposed on the etch stop layer 260 and the insulation layer 280, respectively. In some embodiments, the metal layers 3274, 3294 still have lower (electric) resistance than the metal layers 3272, 3292. In some embodiments, the metal layers 3274, 3294 laterally protrude with respect to the metal layers 3272, 3292. As for the semiconductor device SD30 of FIG. 21, also the semiconductor device SD40 of FIG. 22 may be manufactured by forming fewer layers in the stack of FIG. 4, while the presence of the metal layers 3274, 3294 allows finer control of the applied electric field, thus enabling operation of the memory array 3240 as filamentary RRAM.

Figure 23:
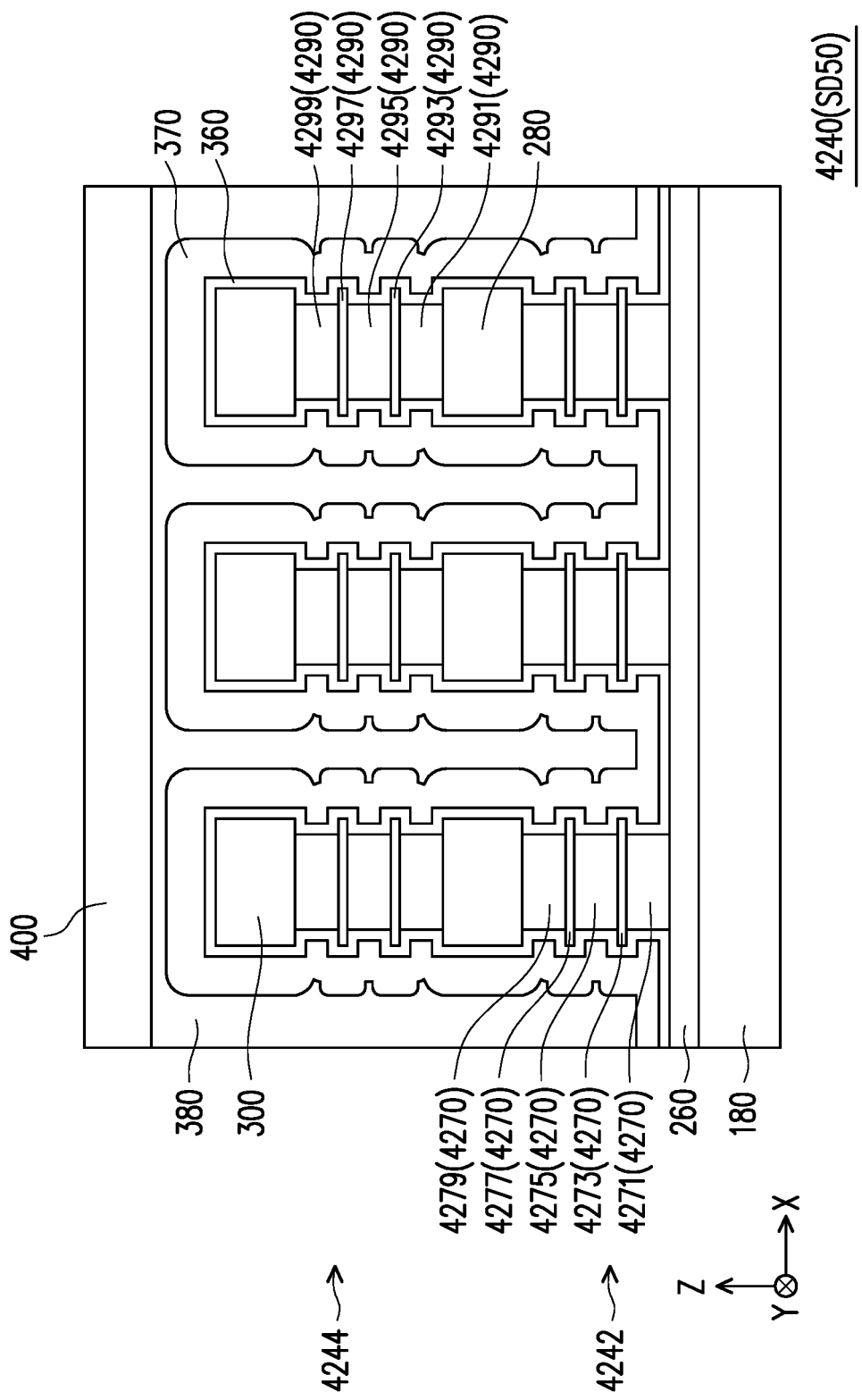
Figure 24:
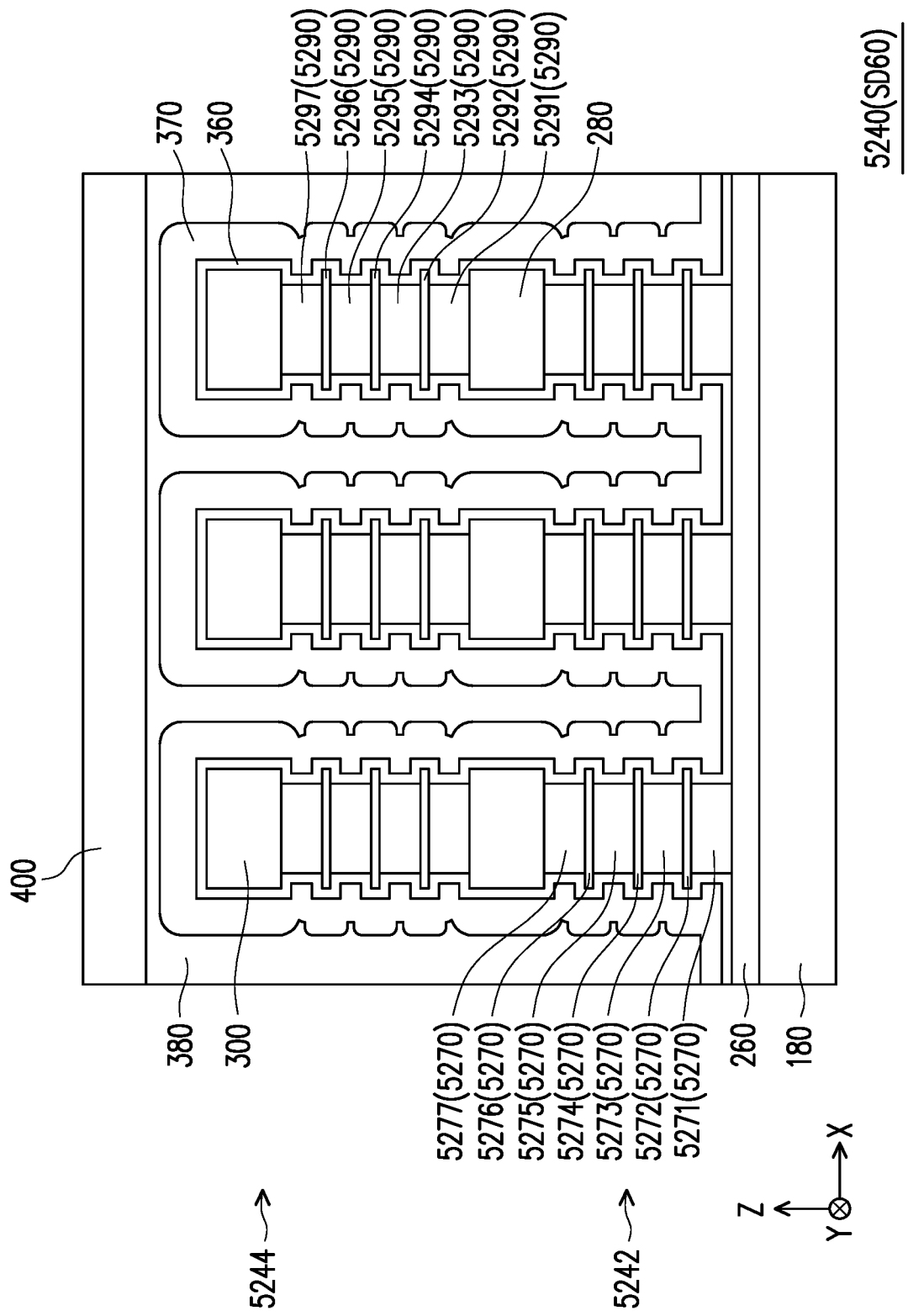

In FIG. 23 is illustrated a portion of a memory array 4240 of a semiconductor device SD50 according to some embodiments of the disclosure. A difference between the memory array 4240 and the memory array 240a of FIG. 13B lies in the structure of the bit lines 4270 and 4290 of the memory cells 4242 and 4244, respectively. Taking as an example a bit line 4270, the bit lines 4270 may include more metal layers than the bit lines 270 of the memory array 240a. For example, a bit line 4270 includes five metal layers, 4271, 4273, 4275, 4277, 4279, of which three metal layers 4271, 4275, 4279 may be formed selecting material and processes from the options previously described with reference to the metal layers 272 illustrated in FIG. 5A, and two metal layers 4273, 4277 may be formed selecting material and processes from the options previously described for the metal layers 274 (also illustrated in FIG. 5A). The metal layers 4271, 4275, 4279 may be thicker than the two metal layers 4273, 4277, for example according to the ranges described above for the metal layers 272 and 274. The metal layers 4271, 4275, 4279 are alternately stacked with the metal layers 4273, 4277. In some embodiments, the metal layers 4273, 4277 laterally protrude with respect to the metal layers 4271, 4275, 4279. In some embodiments, the metal layers 4273, 4277, have lower (electric) resistance than the metal layers 4271, 4275, 4279. The bit lines 4290 may have a similar structure to the one just described for the bit lines 4270, having the metal layers 4291, 4295, 4299 (fabricated as the metal layers 4271, 4275, 4279) alternately stacked with the metal layers 4293, 4297 (fabricated as the metal layers 4273, 4277). In some embodiments, fabricating bit lines 4270, 4290 with multiple metal layers 4273, 4277, 4293, 4297 may allow for even finer tuning of the applied electrical field without significant increase in complexity or cost of the manufacturing process.

It will be apparent that the disclosure is not limited by the number of thinner metal layers included in the bit lines. For example, in the memory array 5240 of the semiconductor device SD60 illustrated in FIG. 24, the bit lines 5270, 5290 of the memory cells 5242, 5242 include seven metal layers 5271-5277, 5291-5297 each, with four metal layers 5271, 5273, 5275, 5277, or 5291, 5293, 5295, 5297 alternately stacked with three metal layers 5272, 5274, 5276, or 5292, 5294, 5296, respectively. The metal layers 5271, 5273, 5275, 5277, 5291, 5293, 5295, 5297 may be formed selecting materials and processes from the options previously described with reference to the metal layers 272 illustrated in FIG. 5A, and the metal layers 5272, 5274, 5276, 5292, 5294, 5296 may be formed selecting materials and processes from the options previously described for the metal layers 274 (also illustrated in FIG. 5A). In some embodiments, the metal layers 5272, 5274, 5276, 5292, 5294, 5296 laterally protrude with respect to the adjacent metal layers 5271, 5273, 5275, 5277, 5291, 5293, 5295, 5297. In some embodiments, the metal layers 5272, 5274, 5276, 5292, 5294, 5296 have lower (electric) resistance than the metal layers 5271, 5273, 5275, 5277, 5291, 5293, 5295, 5297. In some embodiments, the metal layers 5271, 5273, 5275, 5277, 5291, 5293, 5295, 5297 are up to 10 times thicker than the metal layers 5272, 5274, 5276, 5292, 5294, 5296. In some embodiments, fabricating bit lines 5270, 5290 with multiple metal layers 5272, 5274, 5276, 5292, 5294, 5296 may allow for even finer tuning of the applied electrical field without significant increase in complexity or cost of the manufacturing process.

In accordance with some embodiments of the disclosure, a memory cell includes a pair of metal layers, an insulating layer, a memory layer, a selector layer, and a word line. The pair of metal layers extends in a first direction. A first metal layer of the pair of metal layers is disposed in contact with a second metal layer of the pair of metal layers. The first metal layer includes a first material. The second metal layer includes a second material. The second metal layer laterally protrudes with respect to the first metal layer along a second direction perpendicular to the first direction. The insulating layer extends in the first direction and is disposed on top of the pair of metal layers. The memory layer conformally covers sides of the pair of metal layers. The selector layer is disposed on the memory layer. The word line extends along the second direction on the selector layer over the pair of metal layers.

In accordance with some embodiments of the disclosure, a semiconductor device includes a substrate and a memory array. The memory array is disposed over the substrate. The memory array includes at least one film stack, a memory layer, a selector layer, and at least one word line. The at least one film stack is disposed over the substrate. The at least one film stack includes conductive layers and insulating layers alternately arranged. Each conductive layer includes a first material and a second material in direct contact with each other. A resistivity value of the second material is lower than a resistivity value of the first material. The memory layer is disposed over the substrate and covers a sidewall and a top of the at least one film stack. The selector layer is disposed on the memory layer. The at least one word line is disposed on the selector layer and extends transversely with respect to the at least one film stack.

In accordance with some embodiments of the disclosure, a manufacturing method of a semiconductor device includes the following steps. A first metallic material having a first resistivity is deposited. A second metallic material is deposited in direct contact with the first metallic material. The second metallic material has a second resistivity higher than the first resistivity. An insulating material is deposited over the second metallic material. The first metallic material, the second metallic material, and the insulating material are patterned so that the second metallic material is recessed with respect to side edges of the first metallic material and the insulating material. A memory material is conformally deposited over the patterned first metallic material, second metallic material, and insulating material. A selector material is conformally deposited over the memory material. A third metallic material is deposited over the selector material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a pair of metal layers extending in a first direction, wherein a first metal layer of the pair of metal layers is disposed in contact with a second metal layer of the pair of metal layers, the first metal layer comprises a first material, the second metal layer comprises a second material, and the second metal layer laterally protrudes with respect to the first metal layer along a second direction perpendicular to the first direction;
   an insulating layer extending in the first direction and disposed on top of the pair of metal layers;
   a memory layer, conformally covering sides of the pair of metal layers;
   a selector layer disposed on the memory layer; and
   a word line, extending along the second direction on the selector layer over the pair of metal layers.

2. The memory cell of claim 1, wherein the second metal layer has a lower electric resistance than the first metal layer.

3. The memory cell of claim 1, wherein the first metal layer is disposed between the second metal layer and the insulating layer.

4. The memory cell of claim 3, further comprising a third metal layer extending along the first direction, wherein the second metal layer is disposed between the third metal layer and the first metal layer and laterally protrudes with respect to both of the third metal layer and the first metal layer.

5. The memory cell of claim 4, wherein a material of the third metal layer has a same composition as the material of the first metal layer.

6. The memory cell of claim 1, wherein a ratio of a thickness of the first metal layer to a thickness of the second metal layer is in a range from 20:1 to 1:1, and the thicknesses are measured in a stacking direction of the first metal layer and the second metal layer.

7. The memory cell of claim 1, wherein the material of the first metal layer includes at least one selected from tungsten, titanium, titanium nitride, ruthenium, tantalum, and tantalum nitride, and
   the material of the second metal layer includes at least one selected from tungsten, titanium, titanium nitride, ruthenium, tantalum, and tantalum nitride.

8. The memory cell of claim 1, wherein the memory layer comprises a material capable of switching between two different states having different resistance values according to an applied voltage.

9. A memory cell, comprising:
   a first metal layer;
   a second metal layer underlying the first metal layer, the first and second metal layers extending lengthwise in a same direction, and the second metal layer extending widthwise beyond sides of the first metal layer;
   an insulating layer overlying the first metal layer;
   a memory layer, conformally lining the sides of the first metal layer and sides of the second metal layer;
   a selector layer overlying the memory layer; and
   a word line layer overlying the selector layer, the word line layer extending lengthwise that is in parallel to a widthwise direction of the second metal layer.

10. The memory cell of claim 9, wherein the second metal layer has a lower electric resistance than the first metal layer.

11. The memory cell of claim 9, wherein a material of the first metal layer is different from a material of the second metal layer.

12. The memory cell of claim 11, further comprising:
   a third metal layer underlying the second metal layer, wherein the second metal layer extends widthwise beyond sides of the third metal layer.

13. The memory cell of claim 12, wherein a material of the third metal layer has a same composition as a material of the first metal layer.

14. The memory cell of claim 9, wherein the memory layer comprises a material capable of switching between two different states having different resistance values according to an applied voltage.

15. A memory cell, comprising:
   a bit line stack comprising:
      an upper metal layer and a middle metal layer connected to the upper metal layer, the middle metal layer laterally extending beyond sides of the upper metal layer;
   an insulating layer overlying the bit line stack;
   a memory layer, blanketly covering the bit line stack;
   a selector layer overlying the memory layer; and
   a word line layer overlying the selector layer, the word line layer extending lengthwise that is in perpendicular to a lengthwise direction of the bit line stack.

16. The memory cell of claim 15, wherein the middle metal layer has a lower electric resistance than the upper metal layer.

17. The memory cell of claim 15, wherein a material of the middle metal layer is different from a material of the upper metal layer.

18. The memory cell of claim 15, wherein the bit line stack further comprises a lower metal layer connected to the middle metal layer, and the middle metal layer laterally extends beyond sides of the lower metal layer.

19. The memory cell of claim 18, wherein a material of the lower metal layer has a same composition as a material of the upper metal layer.

20. The memory cell of claim 15, wherein the memory layer comprises a material capable of switching between two different states having different resistance values according to an applied voltage.

* * * * *